(12) United States Patent
Wang et al.

(10) Patent No.: US 12,542,535 B2
(45) Date of Patent: Feb. 3, 2026

(54) ACOUSTIC WAVE FILTER WITH DIFFERENT TYPES OF RESONATORS IN ACOUSTIC FILTER COMPONENT AND/OR MULTIPLEXER

(71) Applicant: Skyworks Solutions, Inc., Irvine, CA (US)

(72) Inventors: Yiliu Wang, Irvine, CA (US); Jiansong Liu, Fremont, CA (US); Li Chen, Irvine, CA (US); Nan Wu, Irvine, CA (US); Toru Jibu, Kobe (JP)

(73) Assignee: Skyworks Solutions, Inc., Irvine, CA (US)

( * ) Notice: Subject to any disclaimer, the term of this patent is extended or adjusted under 35 U.S.C. 154(b) by 548 days.

(21) Appl. No.: 17/079,024

(22) Filed: Oct. 23, 2020

(65) Prior Publication Data
US 2021/0126625 A1    Apr. 29, 2021

Related U.S. Application Data

(60) Provisional application No. 62/925,606, filed on Oct. 24, 2019, provisional application No. 62/925,632, filed on Oct. 24, 2019.

(51) Int. Cl.
*H03H 9/64* (2006.01)
*H03H 9/02* (2006.01)
(Continued)

(52) U.S. Cl.
CPC ...... *H03H 9/6483* (2013.01); *H03H 9/02228* (2013.01); *H03H 9/02834* (2013.01);
(Continued)

(58) Field of Classification Search
CPC .. H03H 9/02; H03H 9/25; H03H 9/54; H03H 9/72
See application file for complete search history.

(56) References Cited

U.S. PATENT DOCUMENTS 5,726,610 A * 3/1998 Allen ............. H03H 9/6483
333/133
6,424,238 B1 * 7/2002 Penunuri ............. H03H 9/605
333/187
(Continued)

FOREIGN PATENT DOCUMENTS

WO   WO 02/054592    7/2002
WO   WO 2013/097794  7/2013

OTHER PUBLICATIONS

Nokia press release, "Nokia can instantly migrate 5 Million legacy 4G radio units to 5G", 2020 (Year: 2020).*
(Continued)

*Primary Examiner* — Andrea Lindgren Baltzell
*Assistant Examiner* — Alan Wong
(74) *Attorney, Agent, or Firm* — Knobbe, Martens, Olson & Bear, LLP

(57) ABSTRACT

Aspects of this disclosure relate to acoustic wave filters that include different types of acoustic wave resonators for series resonators and shunt resonators. In certain embodiments, an acoustic filter component includes a first die including surface acoustic wave resonators and a second die including bulk acoustic wave resonators. An interdigital transducer electrode of a surface acoustic wave resonator can be a side of the first die. An electrode of a bulk acoustic wave resonator can be on a side of the second die facing the side of the first die with the interdigital transducer electrode thereon. An acoustic wave filter can include series resonators on one of the first and second die and shunt resonators on the other of the first and second die.

19 Claims, 22 Drawing Sheets

(51) Int. Cl.
    *H03H 9/145*    (2006.01)
    *H03H 9/25*     (2006.01)
    *H03H 9/68*     (2006.01)
    *H03H 9/70*     (2006.01)
    *H03H 9/72*     (2006.01)
    *H04B 1/00*     (2006.01)

(52) U.S. Cl.
    CPC .............. *H03H 9/145* (2013.01); *H03H 9/25* (2013.01); *H03H 9/68* (2013.01); *H03H 9/703* (2013.01); *H03H 9/72* (2013.01); *H04B 1/0057* (2013.01)

(56) References Cited

U.S. PATENT DOCUMENTS

| | | | | |
|---|---|---|---|---|
| 6,924,583 | B2* | 8/2005 | Lin | H03H 9/542 |
| | | | | 310/366 |
| 7,378,922 | B2* | 5/2008 | Kubo | H03H 9/1092 |
| | | | | 333/133 |
| 7,446,629 | B2* | 11/2008 | Nakamura | H03H 9/14588 |
| | | | | 333/133 |
| 7,683,736 | B2 | 3/2010 | Inoue et al. | |
| 8,228,137 | B2* | 7/2012 | Inoue | H03H 9/725 |
| | | | | 333/132 |
| 8,552,818 | B2* | 10/2013 | Kadota | H03H 9/02559 |
| | | | | 333/195 |
| 9,246,533 | B2 | 1/2016 | Fujiwara et al. | |
| 9,331,667 | B2* | 5/2016 | Steiner | H10N 30/87 |
| 9,419,585 | B2* | 8/2016 | Yasuda | H03H 9/725 |
| 9,520,857 | B2 | 12/2016 | Fujiwara et al. | |
| 9,831,851 | B2* | 11/2017 | Moulard | H10N 30/50 |
| 10,141,912 | B2* | 11/2018 | Hurwitz | H01L 24/13 |
| 10,284,176 | B1 | 5/2019 | Solal | |
| 10,367,475 | B2* | 7/2019 | Caron | H03H 9/70 |
| 10,530,335 | B2* | 1/2020 | Nosaka | H03H 9/568 |
| 10,530,336 | B2 | 1/2020 | Takamine | |
| 10,567,031 | B2* | 2/2020 | Nosaka | H03H 9/6403 |
| 10,630,257 | B2 | 4/2020 | Nosaka | |
| 10,720,903 | B2 | 7/2020 | Nosaka | |
| 10,826,543 | B2 | 11/2020 | Ella | |
| 11,121,694 | B2* | 9/2021 | Ueno | H03H 7/463 |
| 11,139,798 | B2 | 10/2021 | Nosaka | |
| 11,336,330 | B2* | 5/2022 | Takeuchi | H03F 3/72 |
| 12,176,883 | B2* | 12/2024 | Wang | H03H 9/02834 |
| 2018/0138892 | A1 | 5/2018 | Caron | |
| 2021/0126619 | A1 | 4/2021 | Wang et al. | |

OTHER PUBLICATIONS

"4G LTE frequency band", https://www.sqimway.com/lte_band.php (2023).

* cited by examiner

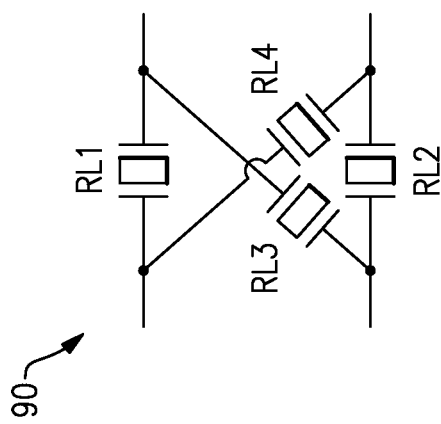
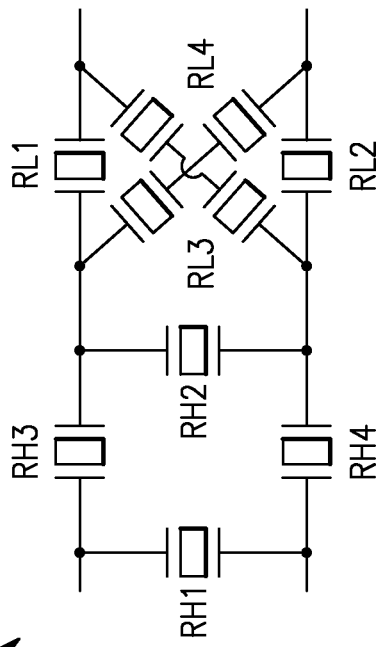
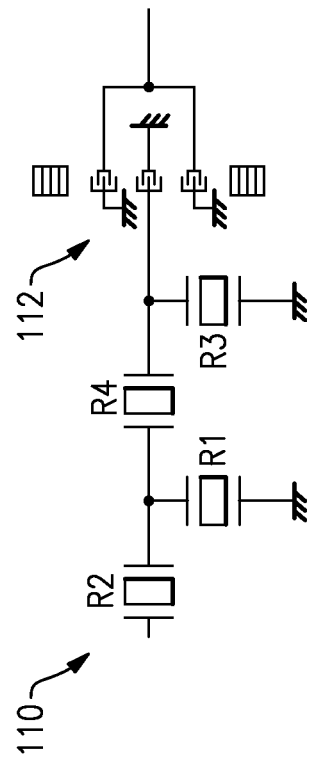

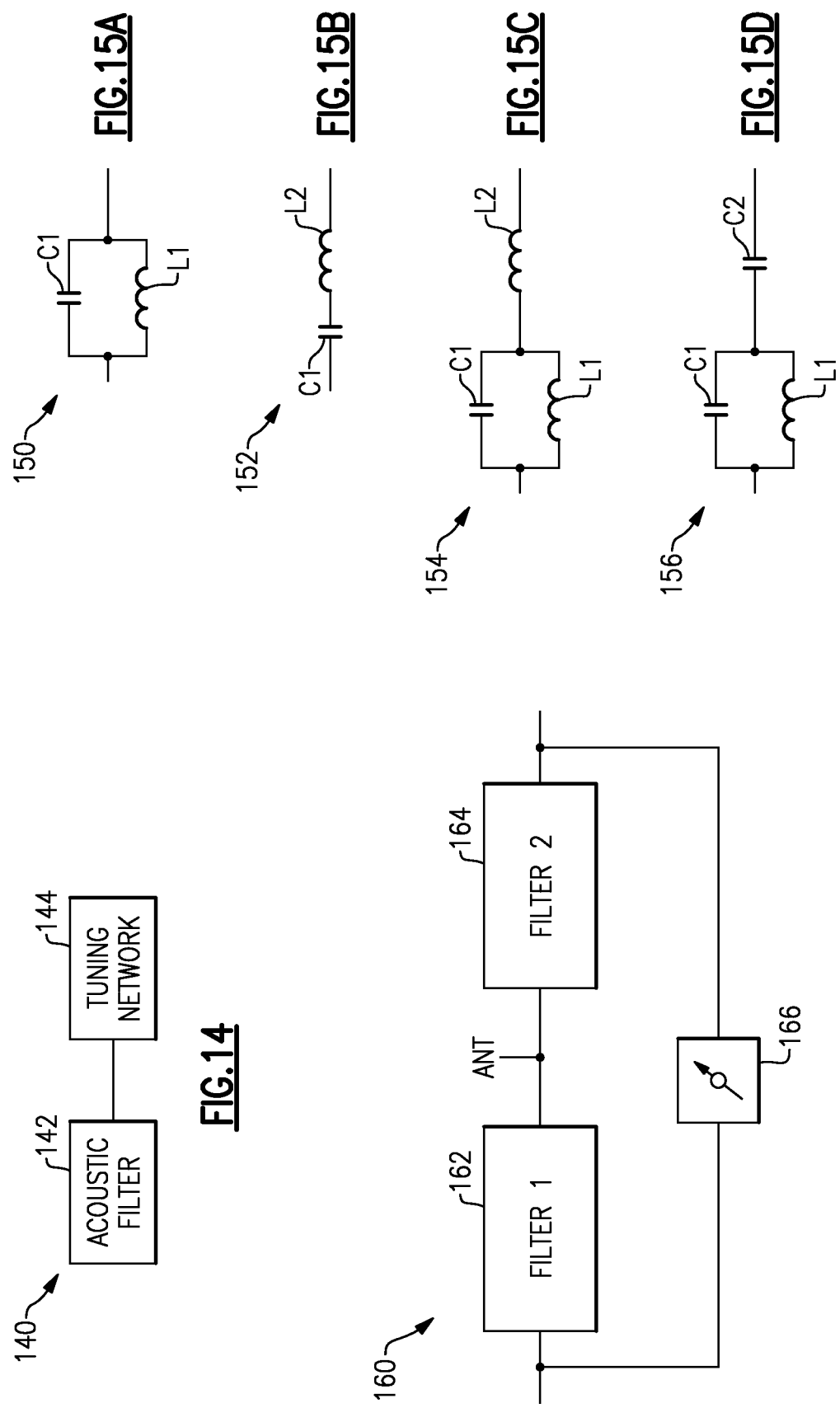

ACOUSTIC WAVE FILTER WITH DIFFERENT TYPES OF RESONATORS IN ACOUSTIC FILTER COMPONENT AND/OR MULTIPLEXER

CROSS REFERENCE TO RELATED APPLICATIONS

Any and all applications for which a foreign or domestic priority claim is identified in the Application Data Sheet as filed with the present application are hereby incorporated by reference under 37 CFR § 1.57. This application claims the benefit of priority of U.S. Provisional Patent Application No. 62/925,606, filed Oct. 24, 2019 and titled "ACOUSTIC WAVE FILTER WITH DIFFERENT TYPES OF RESONATORS," the disclosure of which is hereby incorporated by reference in its entirety herein. This application also claims the benefit of priority of U.S. Provisional Patent Application No. 62/925,632, filed Oct. 24, 2019 and titled "ACOUSTIC WAVE FILTER WITH DIFFERENT TYPES OF RESONATORS IN ACOUSTIC FILTER COMPONENT AND/OR MULTIPLEXER," the disclosure of which is hereby incorporated by reference in its entirety herein.

The present disclosure relates to U.S. patent application Ser. No. 17/079,137, titled "ACOUSTIC WAVE FILTER WITH DIFFERENT TYPES OF RESONATORS," filed on even date herewith, the entire disclosure of which is hereby incorporated by reference herein.

BACKGROUND

Technical Field

Embodiments of this disclosure relate to acoustic wave filters.

Description of Related Technology

An acoustic wave filter can include a plurality of resonators arranged to filter a radio frequency signal. Example acoustic wave resonators include surface acoustic wave (SAW) resonators and bulk acoustic wave (BAW) resonators. A surface acoustic wave resonator can include an interdigital transductor electrode on a piezoelectric substrate. The surface acoustic wave resonator can generate a surface acoustic wave on a surface of the piezoelectric layer on which the interdigital transductor electrode is disposed. In BAW resonators, acoustic waves propagate in a bulk of a piezoelectric layer. Example BAW resonators include film bulk acoustic wave resonators (FBARs) and solidly mounted resonators (SMRs).

Acoustic wave filters can be implemented in radio frequency electronic systems. For instance, filters in a radio frequency front end of a mobile phone can include acoustic wave filters. An acoustic wave filter can be a band pass filter. A plurality of acoustic wave filters can be arranged as a multiplexer. For example, three acoustic wave filters can be arranged as a triplexer. As another example, four acoustic wave filters can be arranged as a quadplexer.

Acoustic wave filters with low insertion loss are generally desirable. However, meeting insertion loss specifications for an entire passband of an acoustic wave filter can be challenging.

SUMMARY OF CERTAIN INVENTIVE ASPECTS

The innovations described in the claims each have several aspects, no single one of which is solely responsible for its desirable attributes. Without limiting the scope of the claims, some prominent features of this disclosure will now be briefly described.

One aspect of this disclosure is an acoustic wave filter that includes a plurality of series resonators and a plurality of shunt resonators. The plurality of series resonators including temperature compensated surface acoustic wave resonators. The plurality of shunt resonators including bulk acoustic wave resonators. The plurality of series resonators and the plurality of shunt resonators are together arranged to filter a radio frequency signal. The acoustic wave filter is a band pass filter.

The plurality of series resonators and the plurality of shunt resonators can be co-packaged. The plurality of series resonators can be on a first die and the plurality of shunt resonators can be on a second die. The second die can be stacked with and attached to the first die. The temperature compensated surface acoustic wave resonators can include respective interdigital transducer electrodes on a side of the first die that is facing a side of the second die on which electrodes of respective bulk acoustic wave resonators are located. An inductor can be co-packaged with the plurality of series resonators and the plurality of shunt resonators. A trap circuit can be co-packaged with the plurality of series resonators and the plurality of shunt resonators. A phase shift circuit can be co-packaged with the plurality of series resonators and the plurality of shunt resonators.

The plurality of series resonators can include a Lamb wave resonator. The plurality of shunt resonators can include a Lamb wave resonator.

The bulk acoustic wave resonators can include a film bulk acoustic wave resonator.

The plurality of shunt resonators and the plurality of series resonators can be arranged in a ladder topology.

The acoustic wave filter can include a multi-mode surface acoustic wave filter coupled in series with the plurality of series resonators.

The plurality of series resonators can include a series bulk acoustic wave resonator, and the temperature compensated surface acoustic wave resonators can be coupled to an input/output port of the acoustic wave filter by way of the series bulk acoustic wave resonator.

The acoustic wave filter can be arranged to support dual connectivity. The acoustic wave filter can have a pass band that includes two operating bands. The acoustic wave filter can be a receive filter. The acoustic wave filter can have a pass band that spans an operating band of a first radio access technology and an operating band of a second radio access technology, in which the first radio access technology is different than the second radio access technology. The acoustic wave filter can have a pass band that spans a Long Term Evolution operating band and a New Radio operating band.

Another aspect of this disclosure is an acoustic wave filter that includes: a plurality of series acoustic wave resonators of a first type; and a plurality of shunt acoustic wave resonators of a second type, the series acoustic wave resonators of the first type having a higher quality factor below respective resonant frequencies than series acoustic resonators of the second type, the shunt acoustic resonators of the second type having a higher quality factor in a frequency range between respective resonant frequencies and respective anti resonant frequencies than shunt acoustic resonators of the first type, and the plurality of series acoustic wave resonators of the first type and the plurality of shunt acoustic wave resonators of the second type together arranged as a band pass filter configured to filter a radio frequency signal.

The plurality of series acoustic resonators of the first type can be temperature compensated surface acoustic wave resonators. The plurality of shunt acoustic resonators of the second type can be bulk acoustic wave resonators.

The plurality of series resonators of the first type can be on a first die and the plurality of shunt resonators of the second type can be on a second die. Electrodes the plurality of series resonators of the first type can be on a side of the first die that is facing a side of the second die on which electrodes of the plurality of shunt resonators of the second type are located.

The acoustic wave filter can be a receive filter with a pass band that spans a first operating band and a second operating band. The first operating band can be associated with a different radio access technology than the second operating band.

Another aspect of this disclosure is an acoustic wave filter that includes a plurality of series resonators including bulk acoustic wave resonators; and a plurality of shunt resonators including temperature compensated surface acoustic wave resonators, the plurality of series resonators and the plurality of shunt resonators together arranged as a band stop filter to filter a radio frequency signal.

The plurality of series resonators and the plurality of shunt resonators can be co-packaged. The plurality of series resonators can be on a first die and the plurality of shunt resonators are on a second die. The second die can be stacked with and attached to the first die. The temperature compensated surface acoustic wave resonators can include respective interdigital transducer electrodes on a side of the second die that is facing a side of the first die on which electrodes of respective bulk acoustic wave resonators are located. An inductor can be co-packaged with the plurality of series resonators and the plurality of shunt resonators. A phase shift circuit can be co-packaged with the plurality of series resonators and the plurality of shunt resonators. The phase shift circuit can include a plurality of interdigital transducer electrodes.

The plurality of series resonators can include a Lamb wave resonator. The plurality of shunt resonators can include a Lamb wave resonator. The bulk acoustic wave resonators can include a film bulk acoustic wave resonator. The plurality of shunt resonators and the plurality of series resonators can be arranged in a ladder topology.

Another aspect of this disclosure is acoustic wave filter that includes: a plurality of series acoustic wave resonators of a first type; and a plurality of shunt acoustic wave resonators of a second type, the series acoustic wave resonators of the first type having a lower resonant frequency than the respective shunt acoustic wave resonators of the second type, the series acoustic resonators of the first type having an anti-resonant frequency that aligns with the resonant frequency of respective shunt acoustic resonators of the second type, and the plurality of series acoustic wave resonators of the second type and the plurality of shunt acoustic wave resonators of the first type together arranged as a band stop filter to filter a radio frequency signal.

Another aspect of this disclosure can include an acoustic wave filter in accordance with any suitable principles and advantages disclosed herein and a radio frequency circuit element coupled to the acoustic wave filter. The acoustic wave filter and the radio frequency circuit element are enclosed within a common module package.

The radio frequency circuit element can be a radio frequency amplifier arranged to amplify a radio frequency signal. The radio frequency circuit element can be a switch configured to selectively couple the acoustic wave filter to an antenna port of the radio frequency module.

Another aspect of this disclosure is a wireless communication device that includes an acoustic wave filter in accordance with any suitable principles and advantages disclosed herein, an antenna operatively coupled to the acoustic wave filter, a radio frequency amplifier operatively coupled to the acoustic wave filter and configured to amplify a radio frequency signal, and a transceiver in communication with the radio frequency amplifier.

The wireless communication device can include a baseband processor in communication with the transceiver.

The wireless communication device can be configured to support dual connectivity. The radio frequency amplifier can be a low noise amplifier, the acoustic wave filter can be a receive filter having a passband that spans a first operating band and a second operating band, and the first operating band can be associated with a different radio access technology than the second operating band.

Another aspect of this disclosure is a method of filtering a radio frequency signal that includes receiving a radio frequency signal at a port of the acoustic wave filter in accordance with any suitable principles and advantages disclosed herein and filtering the radio frequency signal with the acoustic wave filter.

Another aspect of this disclosure is an acoustic filter component that includes a first die and a second die. The first die includes a plurality of surface acoustic wave resonators. The first die includes a side on which an interdigital transducer electrode of a first surface acoustic wave resonator of the surface acoustic wave resonators is positioned. The second die includes a plurality of bulk acoustic wave resonators. The second die includes a side on which an electrode of a first bulk acoustic wave resonator of the bulk acoustic wave resonators is positioned. The side of the second die faces the side of the first die. The first die is stacked with and attached to the second die. The surface acoustic wave resonators are as series resonators of an acoustic wave filter. The bulk acoustic wave resonators are as shunt resonators of the acoustic wave filter.

The acoustic filter component can include sidewalls positioned between the first die and the second die. The sidewalls can be included in a packaging structure that encloses the surface acoustic wave resonators and the bulk acoustic wave resonators in a sealed volume. The first die can be attached to the second die via the sidewalls.

The acoustic filter component can include a tuning inductor on the side of the first die. The acoustic filter component of can include a phase shift circuit co-packaged with the surface acoustic wave resonators and the bulk acoustic wave resonators. The acoustic filter component can include a passive impedance element co-packaged with the surface acoustic wave resonators and the bulk acoustic wave resonators. The passive impedance element can be included in a tuning network coupled to the acoustic wave filter.

The surface acoustic wave resonators can be temperature compensated surface acoustic wave resonators.

The first die can include a second plurality of surface acoustic wave resonators of a second acoustic wave filter, the second die can include a second plurality of bulk acoustic wave resonators of the second acoustic wave filter, and the acoustic wave filter and the second acoustic wave filter can be are included in a multiplexer.

The acoustic wave filter can be a band pass filter.

The acoustic wave filter can be a receive filter having a pass band that spans a first operating band and a second operating band. The first operating band and the second operating band can be associated with different radio access technologies.

Another aspect of this disclosure is an acoustic filter component that includes: a first die including a plurality of surface acoustic wave resonators, the first die including a side on which an interdigital transducer electrode of a first surface acoustic wave resonator of the surface acoustic wave resonators is positioned; and a second die including a plurality of bulk acoustic wave resonators, the second die including a side on which an electrode of a first bulk acoustic wave resonator of the bulk acoustic wave resonators is positioned, the side of the second die facing the side of the first die, the first die stacked with and attached to the second die, surface acoustic wave resonators being arranged as shunt resonators of an acoustic wave filter, and the bulk acoustic wave resonators being arranged as series resonators of the acoustic wave filter.

The acoustic filter component can include sidewalls positioned between the first die and the second die. The sidewalls can be included in a packaging structure that encloses the surface acoustic wave resonators and the bulk acoustic wave resonators in a sealed volume. The first die can be attached to the second die via the sidewalls.

The acoustic filter component can include a passive impedance element co-packaged with the surface acoustic wave resonators and the bulk acoustic wave resonators. The passive impedance element can be included in a tuning network coupled to the acoustic wave filter.

The surface acoustic wave resonators can be temperature compensated surface acoustic wave resonators.

The acoustic wave filter can be a band stop filter.

Another aspect of this disclosure is a multiplexer that includes a first filter and a second filter coupled to the first filter at a common node. The first filter includes a plurality of series temperature compensated surface acoustic wave resonators and a plurality of shunt bulk acoustic wave resonators together arranged to filter a radio frequency signal. The first filter is a band pass filter.

The series temperature compensated surface acoustic wave resonators can be on a first die and the shunt bulk acoustic wave resonators can be on a second die. The series temperature compensated surface acoustic wave resonators can include respective interdigital transducer electrodes on a side of the first die that is facing a side of the second die on which electrodes of respective shunt bulk acoustic wave resonators are located.

The multiplexer can include an inductor that is co-packaged with the series temperature compensated surface acoustic wave resonators and the shunt bulk acoustic wave resonators. The multiplexer can include a trap circuit that is co-packaged with the series temperature compensated surface acoustic wave resonators and the shunt bulk acoustic wave resonators. The multiplexer can include a phase shift circuit that is co-packaged with the series temperature compensated surface acoustic wave resonators and the shunt bulk acoustic wave resonators. The phase shift circuit can include a plurality of interdigital transducer electrodes.

The multiplexer can include a third filter coupled to the common node. The first filter can be a receive filter with a first passband that spans a first receive frequency band and a second receive frequency band, the second filter can be a first transmit filter with a second passband that spans a first transmit band associated with the first receive band, and the third filter can be a second transmit filter with a third passband that spans a second transmit band associated with the second receive band. The multiplexer can support dual connectivity.

The first filter can have a passband that includes two operating bands. The first filter can have a passband that includes two operating bands associated with different radio access technologies. The first filter is arranged can be a receive filter.

The second filter can include series temperature compensated surface acoustic wave resonators and shunt temperature compensated surface acoustic wave resonators.

The first filter further can include a Lamb wave resonator in series with the plurality of the series temperature compensated surface acoustic wave resonators. The first filter can include a shunt Lamb wave resonator.

The shunt bulk acoustic wave resonators can include a film bulk acoustic wave resonator. The shunt bulk acoustic wave resonators and the series temperature compensated surface acoustic wave resonators can be arranged in a ladder topology. The multiplexer can include a multi-mode surface acoustic wave filter coupled in series with the series temperature compensated surface acoustic wave resonators.

The first filter can include a series bulk acoustic wave resonator in series with the series temperature compensated surface acoustic wave resonators. The temperature compensated surface acoustic wave resonators can be coupled to an input/output port of acoustic wave filter by way of the series bulk acoustic wave resonator.

For purposes of summarizing the disclosure, certain aspects, advantages and novel features of the innovations have been described herein. It is to be understood that not necessarily all such advantages may be achieved in accordance with any particular embodiment. Thus, the innovations may be embodied or carried out in a manner that achieves or optimizes one advantage or group of advantages as taught herein without necessarily achieving other advantages as may be taught or suggested herein.

BRIEF DESCRIPTION OF THE DRAWINGS

Embodiments of this disclosure will now be described, by way of non-limiting example, with reference to the accompanying drawings.

FIG. 9 is a schematic diagram of a lattice filter.

FIG. 10 is a schematic diagram of a hybrid ladder and lattice filter.

FIG. 11 is a schematic diagram of an acoustic filter that includes ladder stages and a multi-mode surface acoustic wave filter.

FIG. 14 is a schematic block diagram of an acoustic filter and a tuning network.

FIGS. 15A, 15B, 15C, and 15D are schematic diagrams of tuning networks.

FIG. 16 is a schematic diagram of a multiplexer with a phase shift circuit.

DETAILED DESCRIPTION OF CERTAIN EMBODIMENTS

Figure 1A:
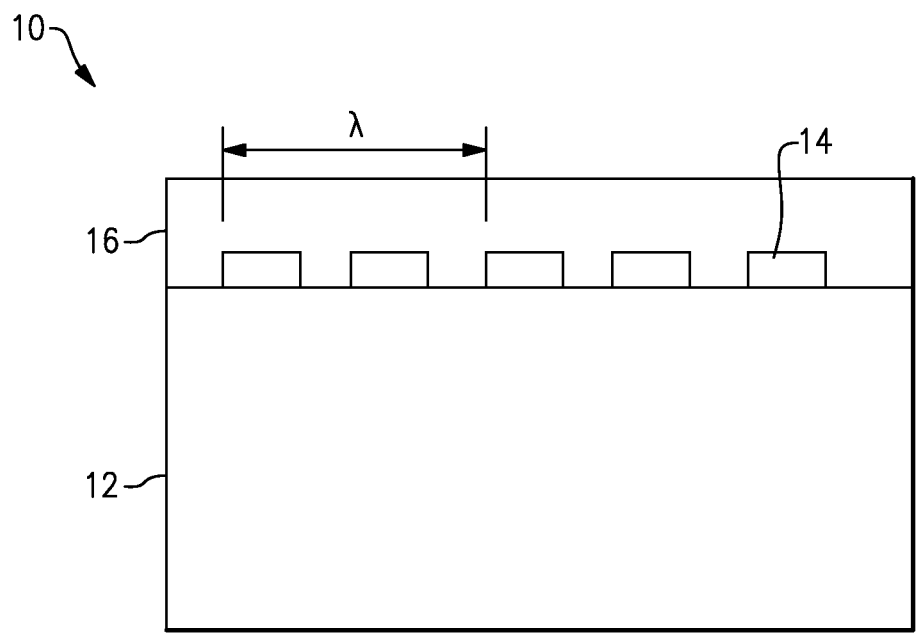
FIG. 1A is a cross sectional view of a temperature compensated surface acoustic wave (TCSAW) device.

The following description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Acoustic filters can implement band pass filters. For example, a band pass filter can be formed from temperature compensated surface acoustic wave (TCSAW) resonators. As another example, a band pass filter can be formed from bulk acoustic wave (BAW) resonators, such as film bulk acoustic wave resonators (FBARs).

In acoustic filter applications, insertion loss improvement is typically desired by customers. Insertion loss improvement can help a receive chain with achieve a desired noise figure. Insertion loss improvement can help with implementing a transmit chain with less power consumption and/or better power handling.

Aspects of this disclosure relate to implementing an acoustic wave filter from more than one type of acoustic resonator. In certain embodiments, an acoustic wave filter can include series TCSAW resonators and shunt BAW resonators. Series TCSAW resonators can achieve higher quality factor (Q) in a frequency range below a resonant frequency (fs), while shunt BAW resonators can achieve a higher Q in a frequency range between fs and an anti-resonant frequency (fp).

Compared to a BAW only acoustic wave filter, an acoustic wave filter with series TCSAW resonators and shunt BAW resonators can achieve better low channel insertion loss. Compared to a TCSAW only acoustic wave filter, an acoustic wave filter with series TCSAW resonators and shunt BAW resonators can achieve better overall insertion loss. Accordingly, an acoustic wave filter with series TCSAW resonators and shunt BAW resonators can achieve desirable insertion loss.

Example TCSAW resonators and BAW resonators will now be discussed.

FIG. 1A is a cross sectional view of a TCSAW device 10. The TCSAW device 10 can be a TCSAW resonator. As illustrated, the TCSAW device 10 includes a piezoelectric layer 12, an interdigital transducer (IDT) electrode 14, and a temperature compensation layer 16 over the IDT electrode 14.

The piezoelectric layer 12 can be a lithium based piezoelectric layer. For example, the piezoelectric layer 12 can be a lithium niobate layer. As another example, the piezoelectric layer 12 can be a lithium tantalate layer.

In the TCSAW device 10, the IDT electrode 14 is over the piezoelectric layer 12. As illustrated, the IDT electrode 14 has a first side in physical contact with the piezoelectric layer 12 and a second side in physical contact with the temperature compensation layer 16. The IDT electrode 14 can include aluminum (Al), molybdenum (Mo), tungsten (W), gold (Au), silver (Ag), copper (Cu), platinum (Pt), ruthenium (Ru), titanium (Ti), the like, or any suitable combination or alloy thereof. The IDT electrode 14 can be a multi-layer IDT electrode in some applications.

In the TCSAW device 10, the temperature compensation layer 16 can bring a temperature coefficient of frequency (TCF) of the TCSAW device 10 closer to zero. The temperature compensation layer 16 can have a positive TCF. This can compensate for a negative TCF of the piezoelectric layer 12. The piezoelectric layer 12 can be lithium niobate or lithium tantalate, which both have a negative TCF. The temperature compensation layer 16 can be a dielectric film. The temperature compensation layer 16 can be a silicon dioxide layer. In some other embodiments, a different temperature compensation layer 16 can be implemented. Some examples of other temperature compensation layers include a tellurium dioxide ($TeO_2$) layer or a silicon oxyfluoride (SiOF) layer.

Figure 1B:
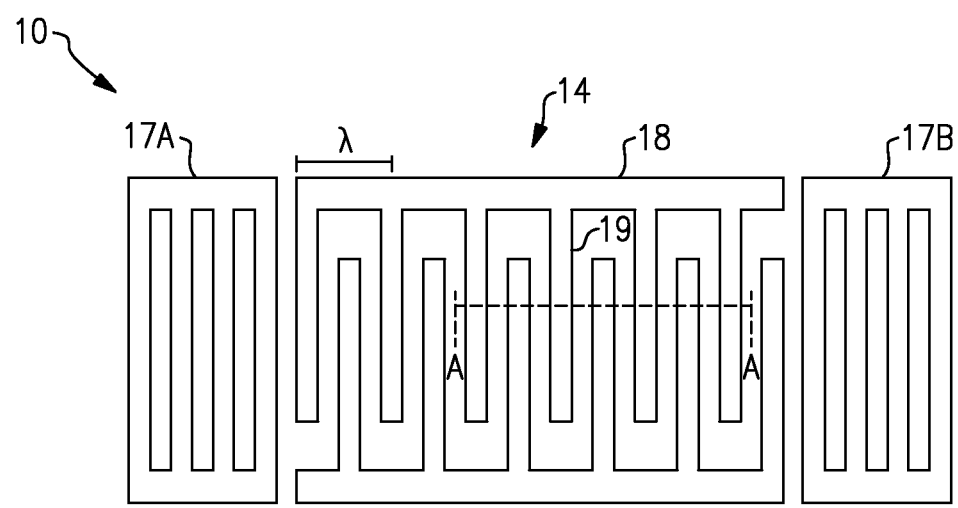
FIG. 1B is a top view of the TCSAW device of FIG. 1A.

FIG. 1B illustrates the IDT electrode 14 of the TCSAW device 10 of FIG. 1A in plan view. The view of the TCSAW device 10 in FIG. 1A is along the dashed line from A to A in FIG. 1B. The temperature compensation layer 16 is not shown in FIG. 1B to focus on the IDT electrode 14. The IDT electrode 14 is positioned between a first acoustic reflector 17A and a second acoustic reflector 17B. The acoustic reflectors 17A and 17B are separated from the IDT electrode 14 by respective gaps. The IDT electrode 14 includes a bus bar 18 and IDT fingers 19 extending from the bus bar 18. The IDT fingers 19 have a pitch of λ. The TCSAW device 10 can include any suitable number of IDT fingers 19. The pitch λ of the IDT fingers 19 corresponds to a resonant frequency of the TCSAW device 10.

Figure 2:
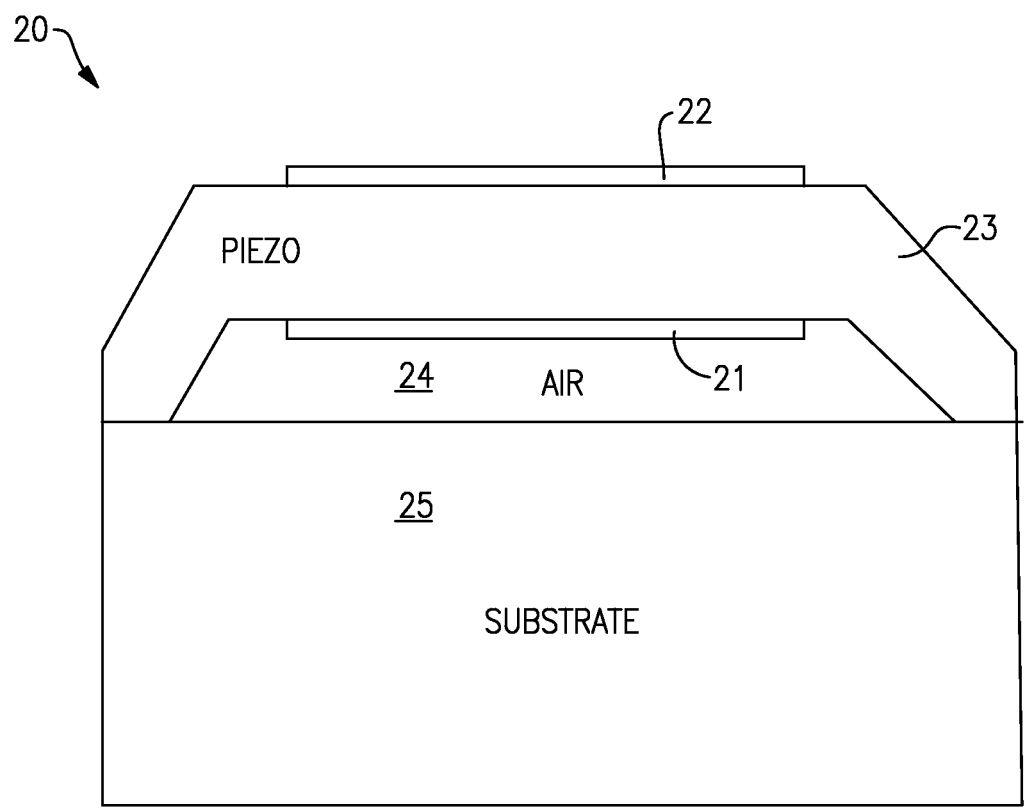
FIG. 2 is a cross sectional view of a bulk acoustic wave (BAW) device.

FIG. 2 is a cross sectional view of a bulk acoustic wave (BAW) device 20. The BAW device 20 can be a BAW resonator. The illustrated BAW device 20 is a film bulk acoustic resonator (FBAR). The BAW device 20 includes a first electrode 21, a second electrode 22, a piezoelectric layer 23, an air cavity 24, and a substrate 25. The electrodes 21 and 22 are on opposing sides of the piezoelectric substrate 23. The piezoelectric layer 23 can be a thin film. The piezoelectric layer 23 can be an aluminum nitride layer, for example. In other instances, the piezoelectric layer 23 can be any other suitable piezoelectric layer. The air cavity 24 is disposed between the electrode 21 and the substrate 25. The substrate 25 can be a semiconductor substrate. For example, the substrate 25 can be a silicon substrate. The substrate 25 can be any other suitable substrate, such as a quartz substrate, a sapphire substrate, a spinel substrate, a ceramic substrate, a glass substrate, or the like. Although not shown in FIG. 2, the BAW device 20 can include a raised frame structure and/or a recessed frame structure.

Figure 3A:
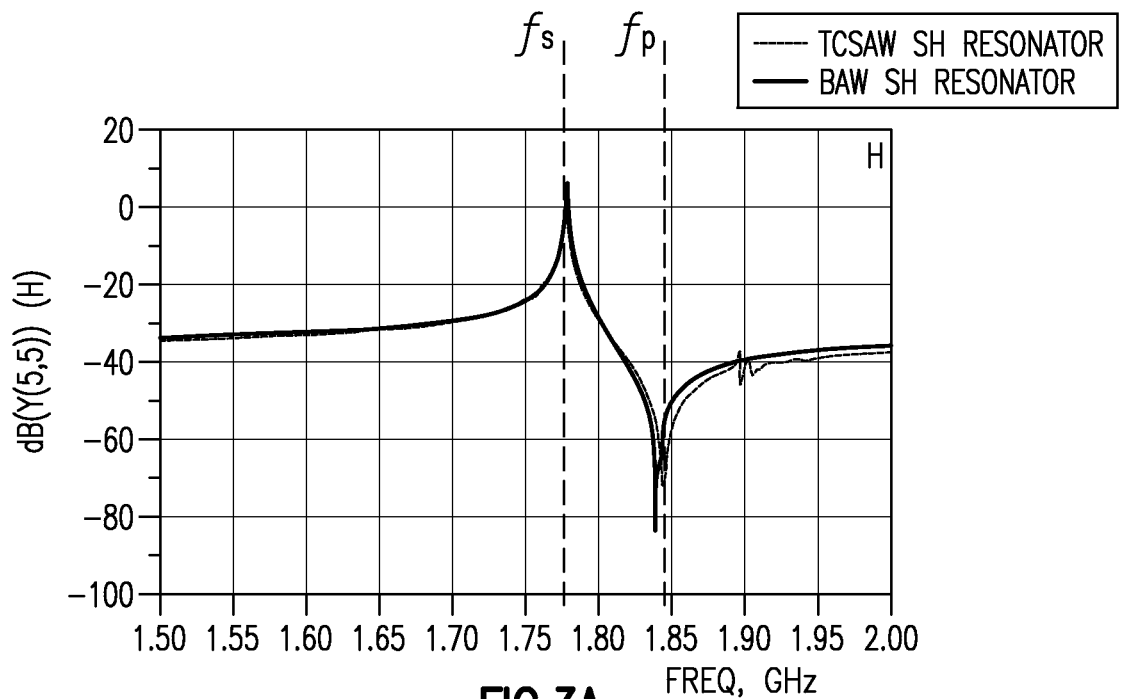
FIG. 3A is a graph that illustrates a resonant frequency (fs) and an anti-resonant frequency (fp) for a shunt TCSAW resonator and a shunt BAW resonator.

FIG. 3A is a graph that illustrates a resonant frequency (fs) and an anti-resonant frequency (fp) for a shunt TCSAW resonator and a shunt BAW resonator. The shunt TCSAW resonator is generally similar to the TCSAW device 10 and the shunt BAW resonator is generally similar to the BAW device 20. FIG. 3A indicates that the shunt TCSAW resonator and the shunt BAW resonator have similar fs and fp.

Figure 3B:
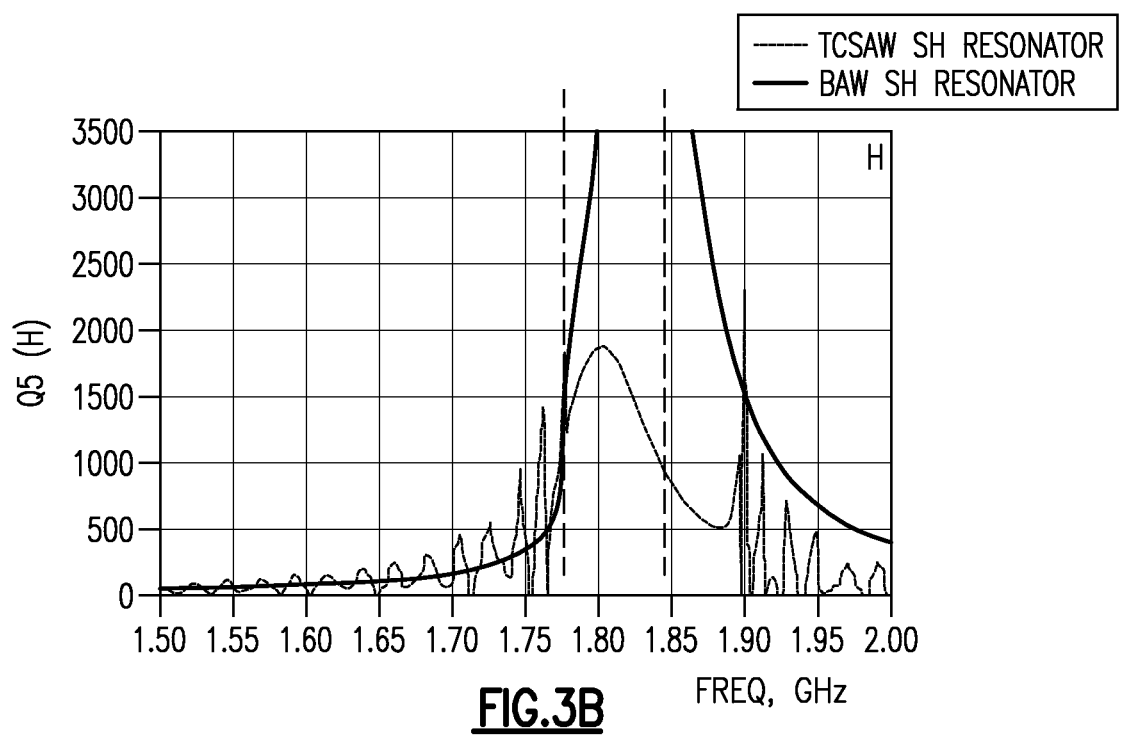
FIG. 3B is a graph comparing quality factor of a shunt TCSAW resonator and a shunt BAW resonator.

FIG. 3B is a graph comparing quality factor of the shunt TCSAW resonator and the shunt BAW resonator corresponding to the graph of FIG. 3A. FIG. 3B indicates that the Q of the shunt TCSAW resonator from fs to fp is significantly lower than the Q for the shunt BAW resonator from fs to fp. In a ladder filter, such shunt TCSAW resonators can cause more loss at an upper band edge than such shunt BAW resonators.

Figure 4A:
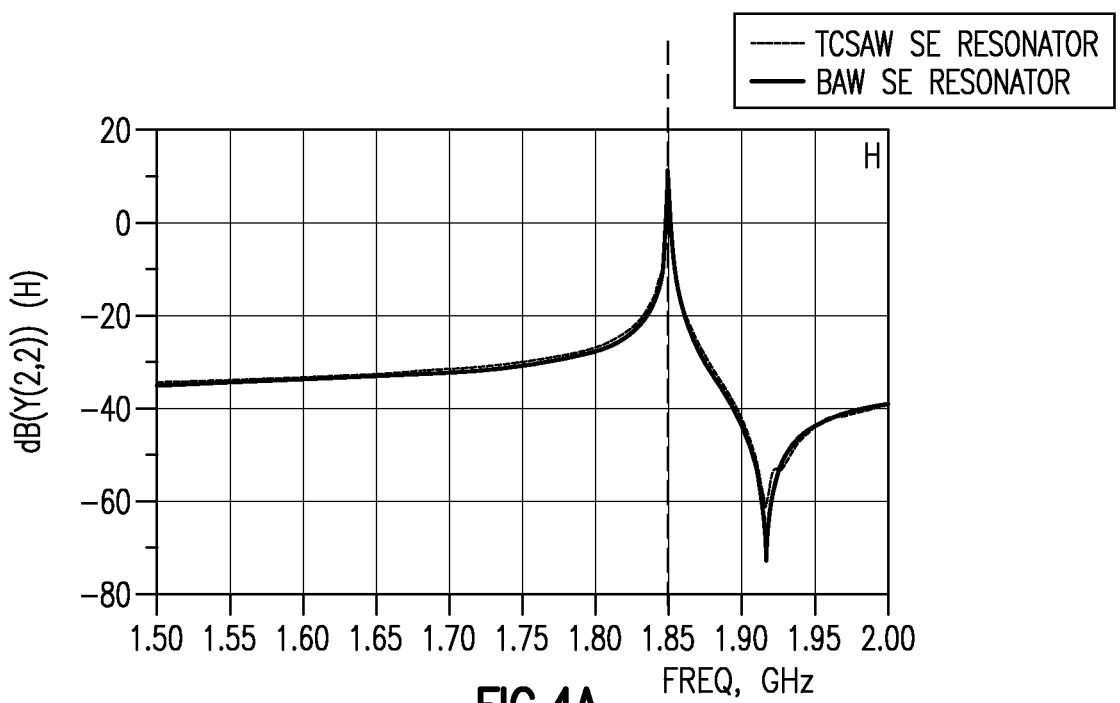
FIG. 4A is a graph that illustrates a resonant frequency and an anti-resonant frequency for a series TCSAW resonator and a series BAW resonator.

FIG. 4A is a graph that illustrates fs and fp for a series TCSAW resonator and a series BAW resonator. The series TCSAW resonator is generally similar to the TCSAW device 10 and the series BAW resonator is generally similar to the BAW device 20. FIG. 4A indicates that the series TCSAW resonator and the series BAW resonator have similar fs and fp.

Figure 4B:
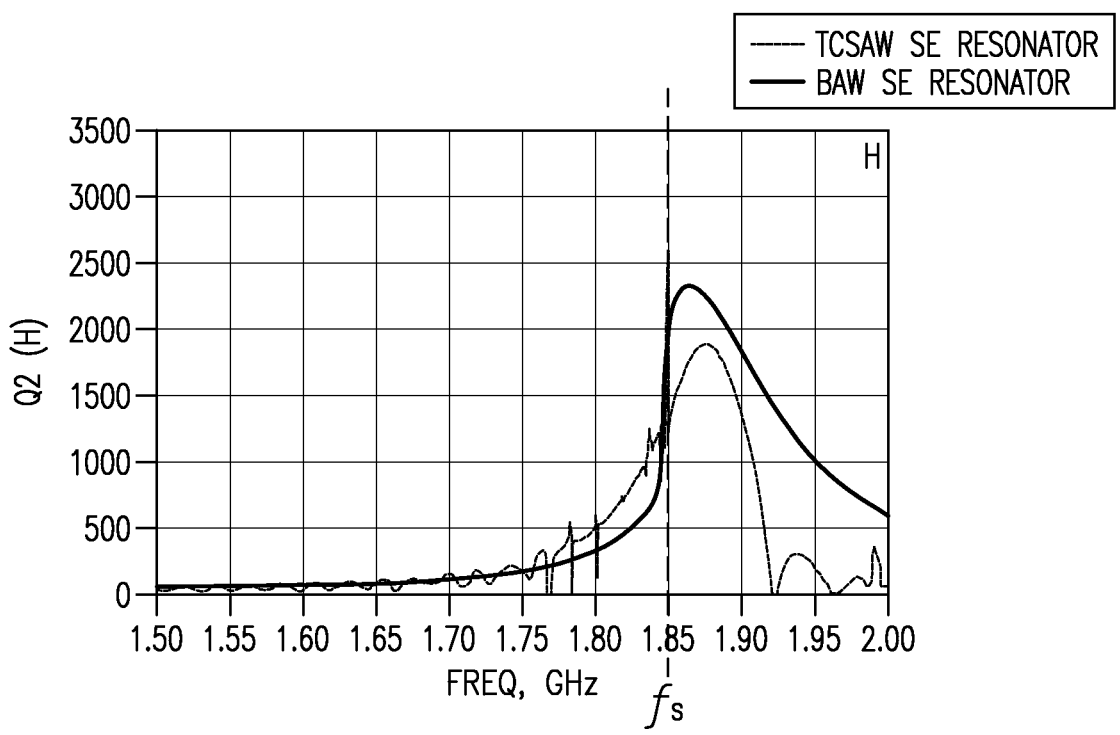
FIG. 4B is a graph comparing quality factor of a series TCSAW resonator and a series BAW resonator.

FIG. 4B is a graph comparing quality factor of the series TCSAW resonator and the series BAW resonator corresponding to the graph of FIG. 4A. The Q of the series BAW resonator below fs is degraded relative to the Q of the TCSAW resonator below fs. In a ladder filter, such series BAW resonators can cause more loss at a lower band edge than such Series TCSAW resonators.

FIGS. 3A to 4B indicate that TCSAW resonators can result in more insertion loss at an upper band edge and that BAW resonators can result in more insertion loss at a lower band edge than TCSAW resonators for a band pass filter. Achieving low insertion loss at both the lower band edge and the upper band edge is generally desirable. An acoustic wave filter with series TCSAW resonators and shunt BAW resonators can achieve desirable insertion loss at both the lower band edge and the upper band edge of a passband. Similarly, an acoustic wave filter with series acoustic wave resonators of a first type and shunt acoustic wave resonators of a second type can also achieve such desirable insertion loss when (a) series resonators of the first type have higher Q than series resonators of the second type in a frequency range below fs and (b) shunt resonators of the second type have higher Q than shunt resonators of the first type in a frequency range between fs and fp. These relationships can be for band pass filters.

In certain applications, acoustic resonators can be arranged as a band stop filter. In such applications, the relationship of the series acoustic resonators and shunt acoustic resonators can be reversed relative to a band pass filter. For example, an acoustic wave filter arranged as a band stop filter with shunt TCSAW resonators and series BAW resonators can achieve desirable characteristics in a stop band. The fp of shunt TCSAW resonators can align to (e.g., be equal to or approximately equal to) fs of respective series BAW resonators for a band stop filter. The shunt TCSAW resonators can have higher resonant frequencies than respective series BAW resonators. The following relationship can hold for resonators of a band stop filter: fs_BAW<fp_BAW=fs_TCSAW<fp_TCSAW. Other suitable types of acoustic resonators with similar characteristics and/or satisfying these relationships can alternatively or additionally be used in a band pass filter to achieve desirable characteristics in a stop band of the band stop filter.

Figure 5:
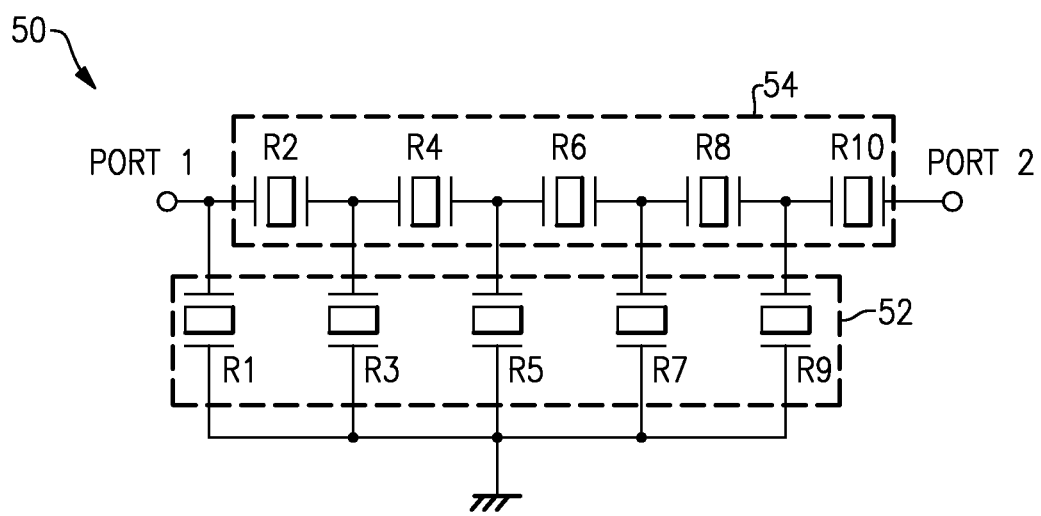
FIG. 5 is a schematic diagram of a ladder filter according to an embodiment.

FIG. 5 is a schematic diagram of a ladder filter 50 according to an embodiment. The ladder filter 50 includes shunt BAW resonators 52 and series TCSAW resonators 54 coupled between RF input/output ports Port1 and Port2. The ladder filter 50 is an example topology of a band pass filter formed from acoustic resonators. In a band pass filter with a ladder filter topology, the shunt resonators can have lower resonant frequencies than the series resonators. The ladder filter 50 can be arranged to filter an RF signal. As illustrated, the shunt BAW resonators include resonators R1, R3, R5, R7, and R9. The illustrated series TCSAW resonators 54 include resonators R2, R4, R6, R8, and R10. The first RF input/output port Port1 can be a transmit port for a transmit filter or a receive port for a receive filter. The second RF input/output port Port2 can be an antenna port. Any suitable number of series acoustic resonators can be in included in a ladder filter. Any suitable number of shunt acoustic wave resonators can be included in a ladder filter.

Figure 6A:
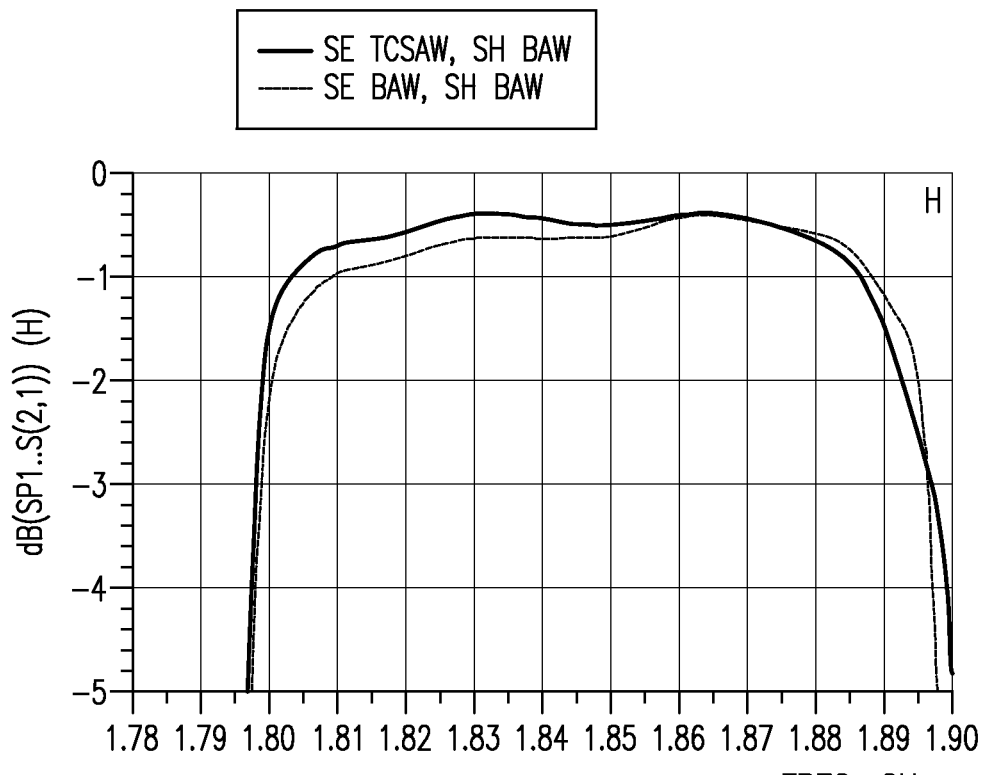
FIG. 6A is a graph comparing insertion loss of the ladder filter of FIG. 5 to an all BAW ladder filter in a passband of the filters.

FIG. 6A is a graph comparing insertion loss of the ladder filter of FIG. 5 to an all BAW ladder filter in a passband of the filters. The ladder filter 50 has a lower insertion loss at a lower band edge compared to the all BAW ladder filter. The low channel insertion loss can improve with series TCSAW resonators due to Q of the series TCSAW resonators being higher below fs than for series BAW resonators.

Figure 6B:
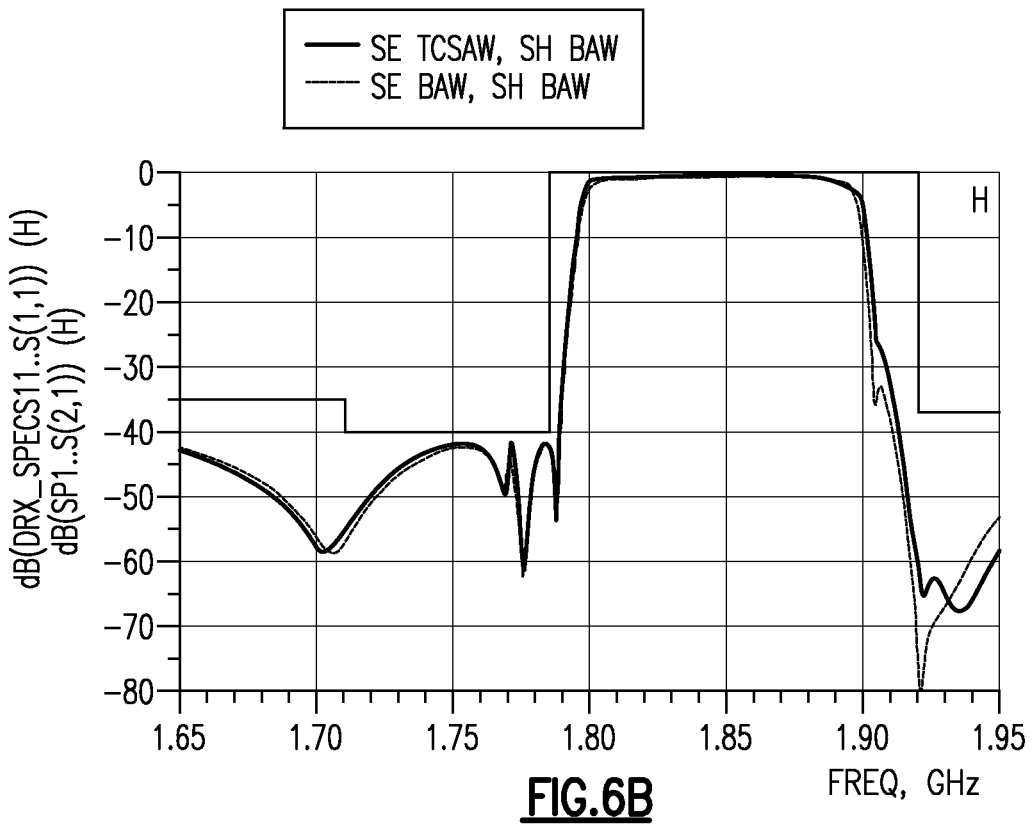
FIG. 6B is a graph comparing insertion loss of the ladder filter of FIG. 5 to an all BAW ladder filter over a wider frequency range than in FIG. 6A.

FIG. 6B is a graph comparing insertion loss of the ladder filter 50 of FIG. 5 to an all BAW ladder filter over a wider frequency range than in FIG. 6A. FIG. 6B indicates that the ladder filter 50 can achieve insertion loss below a specification outside of the passband.

Figure 7A:
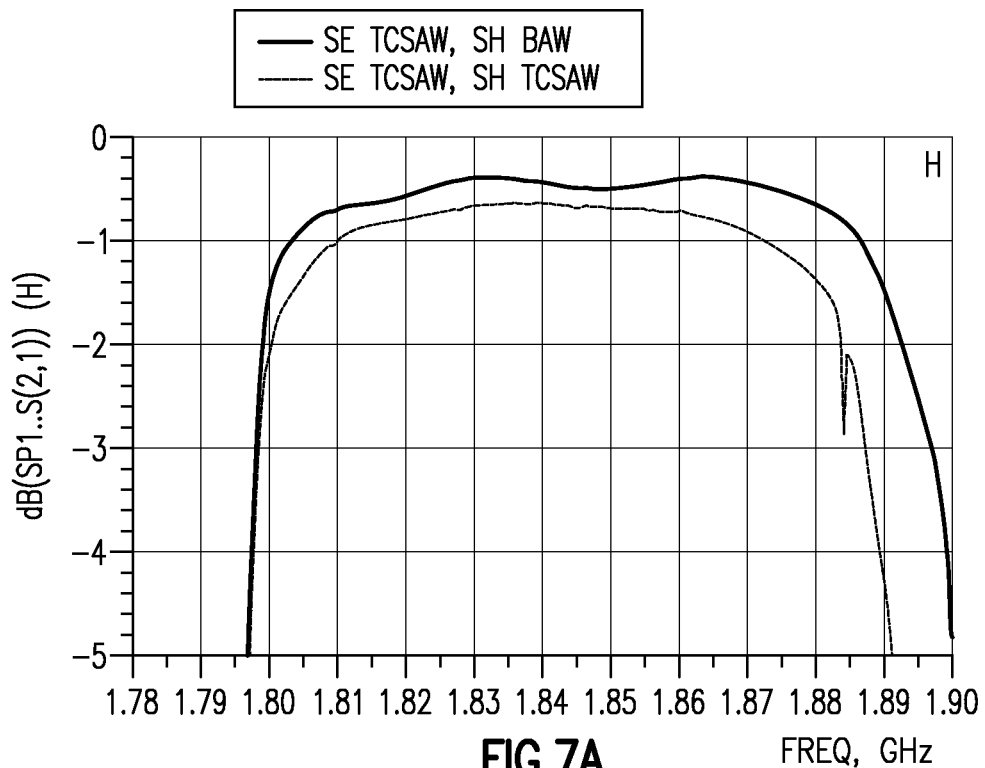
FIG. 7A is a graph comparing insertion loss of the ladder filter of FIG. 5 to an all TCSAW ladder filter in a passband of the filters.

FIG. 7A is a graph comparing insertion loss of the ladder filter 50 of FIG. 5 to an all TCSAW ladder filter in a passband of the filters. The ladder filter 50 has a lower insertion loss throughout the passband compared to the all TCSAW ladder filter. The insertion loss at an upper band edge is significantly improved for the ladder filter 50 compared to the all TCSAW ladder filter. The shunt BAW resonators of the ladder filter 50 can have a higher Q between fs and fp compared to shunt TCSAW resonators of the all TCSAW ladder filter. This higher Q can improve the insertion loss for the ladder filter 50.

Figure 7B:
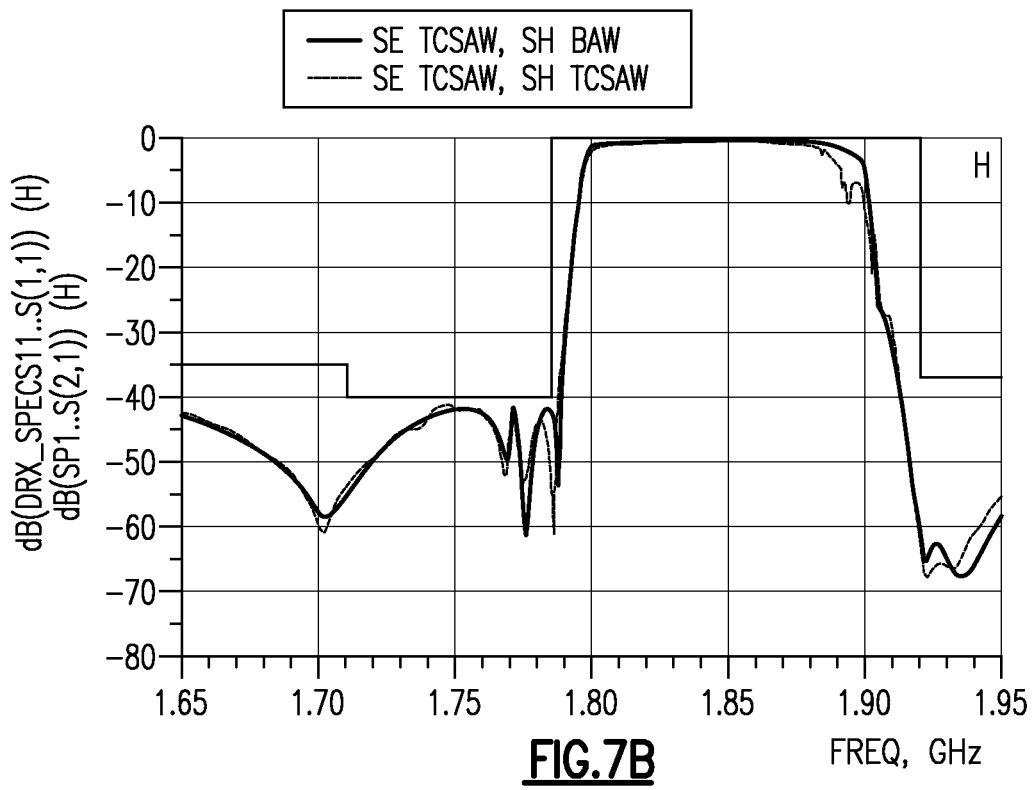
FIG. 7B is a graph comparing insertion loss of the ladder filter of FIG. 5 to an all TCSAW ladder filter over a wider frequency range than in FIG. 7A.

FIG. 7B is a graph comparing insertion loss of the ladder filter 50 of FIG. 5 to an all TCSAW ladder filter over a wider frequency range than in FIG. 7A. FIG. 7B indicates that the ladder filter 50 can achieve insertion loss below a specification outside of the passband.

Figure 8A:
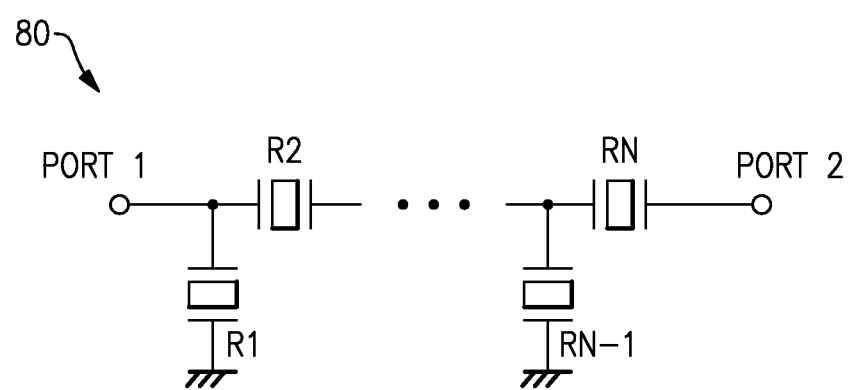
FIG. 8A is a schematic diagram of a ladder filter according to another embodiment.

FIG. 8A is a schematic diagram of a ladder filter 80 according to another embodiment. The ladder filter 80 includes a plurality of acoustic resonators R1, R2, . . . , RN−1, and RN arranged between a first input/output port PORT1 and a second input/output port PORT1. One of the input/output ports PORT1 or PORT2 can be an antenna port. In certain instances, the other of the input/output ports PORT1 or PORT2 can be a receive port. In some other instances, the other of the input/output ports PORT1 or PORT2 can be a transmit port.

The ladder filter 80 illustrates that any suable number of ladder stages can be implemented in a ladder filter in accordance with any suitable principles and advantages disclosed herein. Ladder stages can start with a series resonator or a shunt resonator from any input/output port of the ladder filter 80 as suitable. As illustrated, the first ladder stage from the input/output port PORT1 begins with a shunt resonator R1. As also illustrated, the first ladder stage from the input/output port PORT2 begins with a series resonator RN.

The ladder filter 80 includes shunt resonators R1 and RN−1 and series resonator R2 and RN. The series resonators of the ladder filter 80 including resonators R2 and RN can be acoustic resonators of a first type that have higher Q than series resonators of a second type in a frequency range below fs. The shunt resonators of the ladder filter 80 including resonators R1 and RN−1 can be acoustic resonators of the second type and have higher Q than shunt resonators of the first type in a frequency range between fs and fp. This can lead to a reduced insertion loss. The ladder filter 80 can be a band pass filter with series resonators of the first type and shunt resonators of the second type. In some other embodiments, the series resonators of the ladder filter 80 including resonators R2 and RN can be acoustic resonators of the second type and the shunt resonators of the ladder filter 80 including resonators R1 and RN−1 can be acoustic resonators of the first type. In such embodiments, the ladder filter 80 can be a band pass filter.

The resonators of the first type can be TCSAW resonators and the resonators of the second type can be BAW resonators. Accordingly, the ladder filter 80 can include series TCSAW resonators and shunt BAW resonators in certain embodiments. Such BAW resonators can include FBARs and/or solidly mounted resonators (SMRs).

The resonators of the first type can be multi-layer piezoelectric substrate (MPS) SAW resonators and the resonators of the second type can be BAW resonators. Accordingly, the ladder filter 80 can include series MPS SAW resonators and shunt BAW resonators. Such BAW resonators can include FBARs and/or SMRs in certain embodiments.

The resonators of the first type can be non-temperature compensated SAW resonators and the resonators of the second type can be BAW resonators. Accordingly, the ladder filter 80 can include series non-temperature compensated SAW resonators and shunt BAW resonators in certain embodiments. Such BAW resonators can include be FBARs and/or SMRs.

In a band pass filter with a ladder filter topology, such as the acoustic wave filter 80, the shunt resonators can have lower resonant frequencies than the series resonators. In certain embodiments, the shunt resonators of the acoustic wave filter 80 are BAW resonators and the series resonators of the acoustic wave filter 80 are TCSAW resonators. In such embodiments, the acoustic wave filter 80 can be a band pass filter. Such a band pass filter can achieve low insertion loss at both a lower band edge and an upper band edge of a passband.

In a band stop filter with a ladder filter topology, such as acoustic wave filter 80, the shunt resonators can have higher resonant frequencies than the series resonators. In certain embodiments, the acoustic wave filter 80 is a band stop filter, the shunt resonators of the acoustic wave filter 80 are TCSAW resonators and the series resonators of the acoustic wave filter 80 are BAW resonators. Such a band stop filter can achieve desirable characteristics in a stop band of the band stop filter.

In some applications of an acoustic wave filter that includes TCSAW series resonators and BAW shunt resonators, such as a transmit filter with a relatively high power handling specification, one or more series resonators close to a transmit port (or the lower frequency series resonators) can be BAW resonators to help with ruggedness.

In certain applications, the ladder filter 80 can be included in a multiplexer in which relatively high gamma for the ladder filter 80 in one or more higher frequency carrier aggregation bands is desired. In such applications, an acoustic filter can include shunt resonators of the shunt type and an acoustic resonator of the second type can be included as a series resonator by which other series resonators of the first type are coupled to a common port of the multiplexer. This can increase gamma of the ladder filter 80 in the one or more higher frequency carrier aggregation bands. For example, in applications where the second input/output port PORT2 is a common port of a multiplexer, the series resonator RN can be a BAW resonator, other series resonators of the ladder filter 80 can be TCSAW resonators, and the shunt resonators R1 and RN−1 can be BAW resonators. By having the series resonator RN closest to the common node be a BAW resonator instead of a TCSAW resonator, gamma can be increased for the ladder filter 80 in one or more higher frequency carrier aggregation bands in such applications.

In some applications, the ladder filter 80 can be a transmit filter. In such applications, an acoustic resonator of the second type can be included as a series resonator by which other series resonators of the first type are coupled to a transmit port of the transmit filter. For example, in applications where the second input/output port PORT2 is a transmit port of a transmit filter, the series resonator RN can be a BAW resonator, other series resonators of the ladder filter 80 can be TCSAW resonators, and the shunt resonators R1 and RN−1 can be BAW resonators.

In certain applications, the ladder filter 80 can include more than two types of acoustic resonators. In such applications, the majority of the series resonators can be acoustic resonators of the first type (e.g., TCSAW resonators) and the majority of shunt resonators can be resonators of the second type (e.g., BAW resonators). The ladder filter 80 can include a third type of resonator as a shunt resonator and/or as a series resonator in such applications. The third type of resonator can be a Lamb wave resonator, for example. One such example Lamb wave resonator will be discussed with reference to FIG. 8B. The acoustic wave filter 80 can include a plurality series resonators including temperature compensated surface acoustic wave resonators and a plurality shunt resonators including a Lamb wave resonator arranged as shunt resonator. The acoustic wave filter 80 can include a plurality series resonators including a Lamb wave resonator and a plurality shunt resonators including bulk acoustic wave resonators arranged as shunt resonators.

Figure 8B:
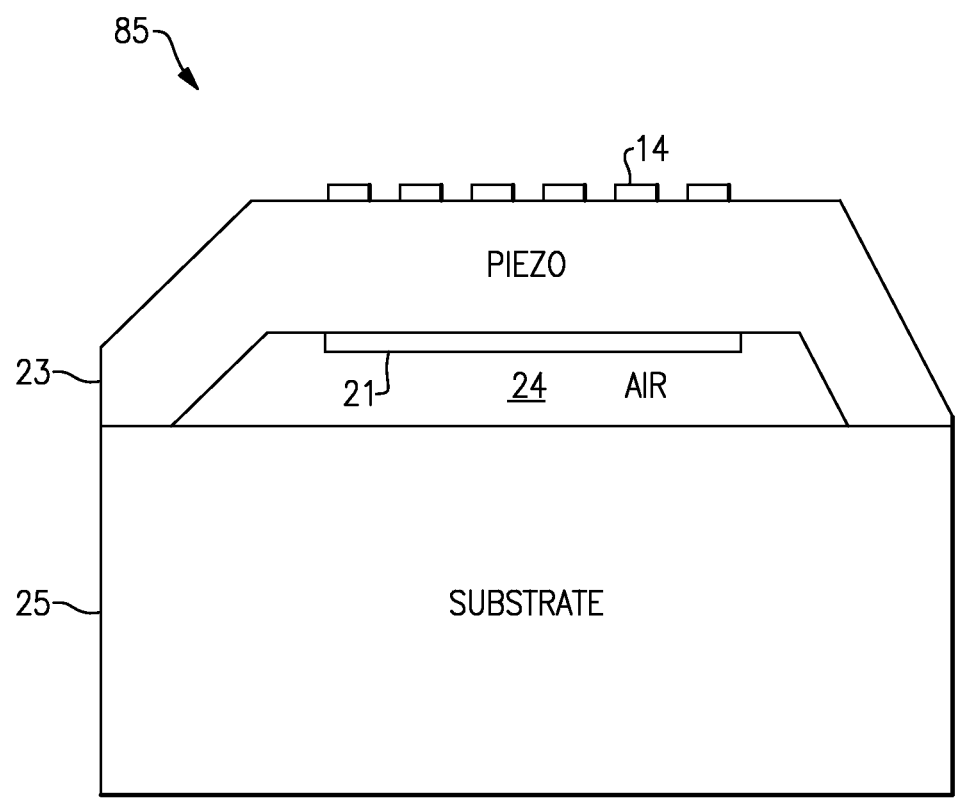
FIG. 8B is a cross sectional diagram of a Lamb wave resonator.

FIG. 8B is a cross sectional diagram of a Lamb wave resonator 85. A Lamb wave resonator can implement one or more series resonators and/or one or more shunt resonators in the ladder filter 80. The Lamb wave resonator 85 includes feature of a SAW resonator and an FBAR. As illustrated, the Lamb wave resonator 85 includes a piezoelectric layer 23, an IDT electrode 14 on the piezoelectric layer 23, and an electrode 21. The resonant frequency of the Lamb wave resonator 85 can be based on the thickness of the piezoelectric layer 23 and/or the geometry of the IDT electrode 14. An air cavity 24 is disposed between the electrode 21 and a substrate 25. Although the Lamb wave resonator 85 of FIG. 8A is a free standing Lamb wave resonator, a solidly mounted resonator (SMR) Lamb wave resonator with a solid acoustic mirror (e.g., acoustic Bragg reflectors) can alternatively or additionally be implemented.

An acoustic wave filter including more than one type of acoustic resonator in accordance with any suitable principles and advantages disclosed herein can be implemented in a variety of different filter topologies. Example filter topologies include without limitation ladder filters, lattice filters, hybrid ladder and lattice filters, filters that include ladder stages and a multi-mode SAW filter, and the like. Some example filter topologies will now be discussed.

FIG. 9 is a schematic diagram of a lattice filter 90. The lattice filter 90 is an example topology of a band pass filter formed from acoustic wave resonators. The lattice filter 80 can be arranged to filter an RF signal. As illustrated, the lattice filter 90 includes acoustic wave resonators RL1, RL2, RL3, and RL4. The acoustic wave resonators RL1 and RL2 are series resonators. The acoustic wave resonators RL3 and RL4 are shunt resonators. The illustrated lattice filter 90 has a balanced input and a balanced output. The lattice filter 90 can be implemented with different type of acoustic resonators in accordance with any suitable principles and advantages disclosed herein. For example, the series resonators RL1 and RL2 can be TCSAW resonators and the shunt resonators RL3 and RL4 can be BAW resonators for a band pass filter.

FIG. 10 is a schematic diagram of a hybrid ladder and lattice filter 100. The illustrated hybrid ladder and lattice filter includes series acoustic resonators RL1, RL2, RH3, and RH4 and shunt acoustic resonators RL3, RL4, RH1, and RH2. The hybrid ladder and lattice filter 100 can be implemented with different type of acoustic resonators in accordance with any suitable principles and advantages disclosed herein. For example, the series resonators RL1, RL2, RH3, and RH4 can be TCSAW resonators and the shunt resonators RL3, RL4, RH1, and RH2 can be BAW resonators for a band pass filter.

FIG. 11 is a schematic diagram of an acoustic filter 110 that includes ladder stages and a multi-mode surface acoustic wave filter 112. The illustrated acoustic filter 110 includes series resonators R2 and R4, shunt resonators R1 and R3, and multi-mode surface acoustic wave filter 112. The filter 110 can be a receive filter. The multi-mode surface acoustic wave filter 112 can be connected to a receive port. The multi-mode surface acoustic wave filter 112 includes longitudinally coupled IDT electrodes. The multi-mode surface acoustic wave filter 112 can include a temperature compensation layer over longitudinally coupled IDT electrodes in certain applications. The series resonators R2 and R4 can be TCSAW resonators and the shunt resonators R1 and R3 can be BAW resonators for a band pass filter. The shunt resonators R1 and R3 being BAW resonators can help with lower skirt steepness and insertion loss.

Acoustic filters disclosed herein include more than one type of acoustic wave resonator. Such filters can be implemented on a plurality of acoustic filter die. The plurality of acoustic filter die can be stacked and co-packaged with each other in certain applications. Embodiments of packaged components will now be discussed.

Figure 12:
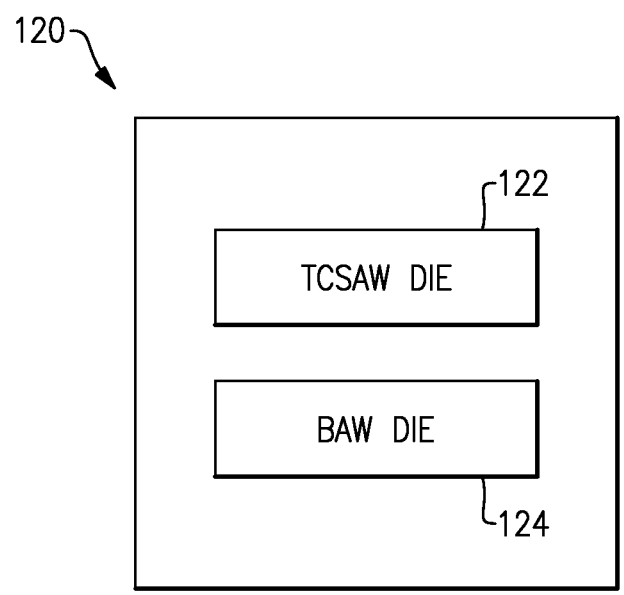
FIG. 12 is a schematic block diagram of a packaged component that includes a plurality of acoustic resonator die.

FIG. 12 is a schematic block diagram of a packaged component 120 that includes a plurality of acoustic resonator die 122 and 124. The packaged component 120 includes a first acoustic resonator die 122 and a second acoustic resonator die 124. An acoustic filter can include series acoustic resonators of the first acoustic resonator die 122 and shunt acoustic resonators of the second acoustic resonator die 124. In certain applications, a duplexer or other multiplexer can include series acoustic resonators on the first acoustic resonator die 122 and shunt acoustic resonators on the second acoustic resonator die 124. The first acoustic resonator die 122 can be a TCSAW die. The second acoustic resonator die 124 can be a BAW die. The acoustic resonator die 122 and 124 can be positioned on a common packaging substrate, such as a laminate substrate. The acoustic resonator die 122 and the acoustic resonator die 124 can be stacked with each other in certain applications.

Figure 13:
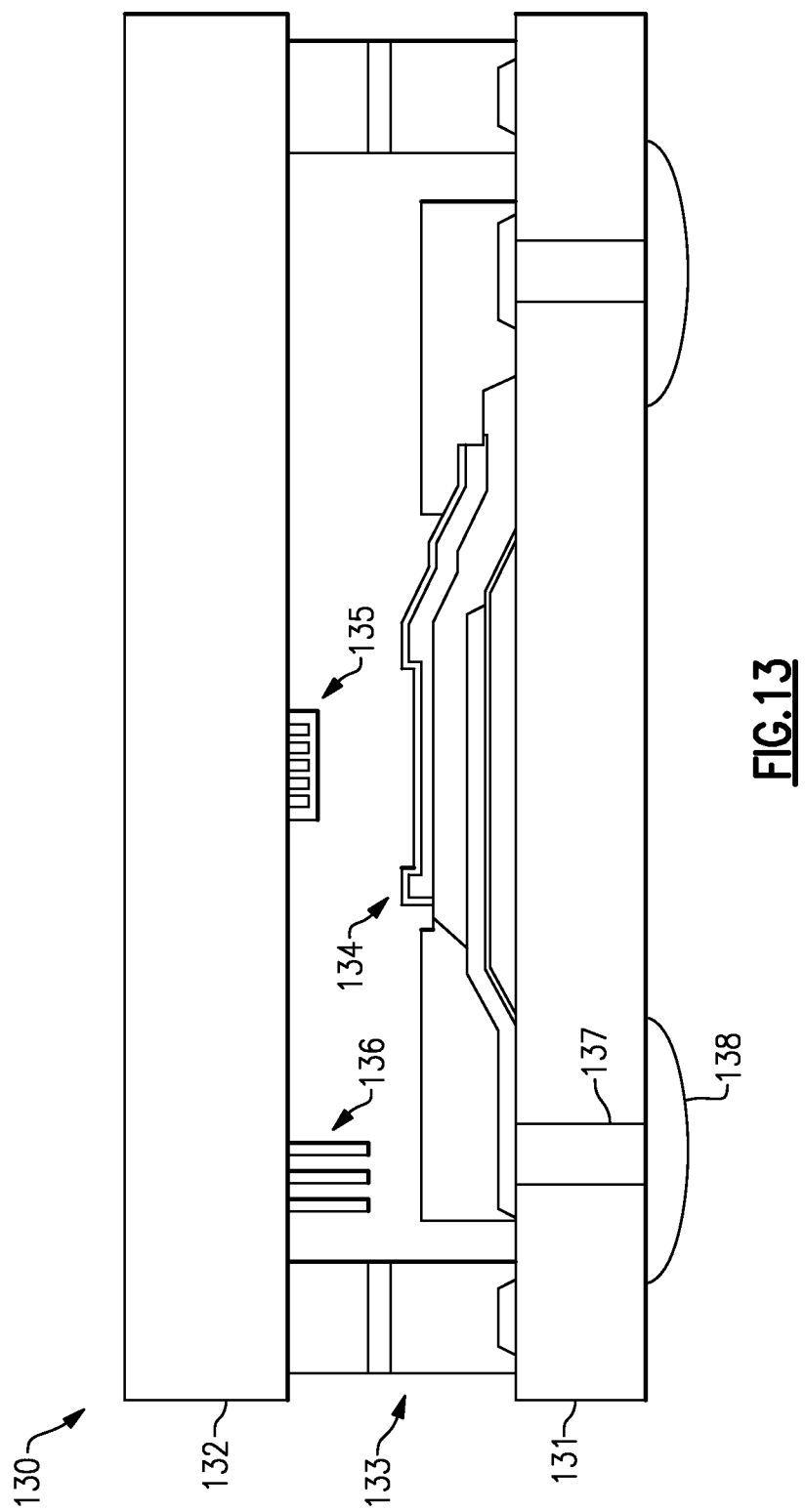
FIG. 13 is a cross sectional diagram of a co-packaged stacked die acoustic filter component according to an embodiment.

FIG. 13 is a cross sectional diagram of a co-packaged stacked die acoustic filter component 130 according to an embodiment. The co-packaged stacked die acoustic filter component 130 can implement the ladder filter 50 of FIG. 5 and/or the ladder filter 80 of FIG. 8A. The co-packaged stacked die acoustic filter component 130 includes a TCSAW die stacked with and attached to a BAW die. The BAW die includes a first substrate 131 and a BAW resonator 134 on the first substrate 131. The first substrate 131 can be a silicon substrate, for example. The illustrated BAW resonator 134 is an FBAR. The illustrated BAW resonator 134 includes a raised frame structure. The TCSAW die includes a second substrate 132 and a TCSAW resonator 135 on the second substrate 132. The second substrate 132 can be a lithium niobate substrate or a lithium tantalate substrate. The BAW resonator 134 can be a shunt resonator of an acoustic wave filter and the TCSAW resonator 135 can be a series resonator of the acoustic wave filter. The BAW resonator 134 can be electrically connected to the TCSAW resonator 135 within the co-packaged stacked die acoustic filter component 130.

Any suitable number of BAW resonators can be included on the first substrate 131. For example, additional BAW resonators can be on the first substrate 131 of the co-packaged stacked die acoustic filter component 130 can be positioned behind and/or in front of the BAW resonator 134. Such BAW resonators can include a plurality of BAW resonators of an acoustic wave filter and/or BAW resonators of two or more acoustic wave filters.

Any suitable number of TCSAW resonators can be included on the second substrate 132. For example, additional TCSAW resonators can be on the second substrate 132 of the co-packaged stacked die acoustic filter component 130 can be positioned behind and/or in front of the TCSAW resonator 135. Such TCSAW resonators can include a plurality of TCSAW resonators of an acoustic wave filter and/or TCSAW resonators of two or more acoustic wave filters.

A Lamb wave element can be included on the second substrate 132 in some applications. Such a Lamb wave element can be a resonator of an acoustic wave filter that includes the TCSAW resonator 135 or a delay element in a phase shift circuit. A Lamb wave element can be included on the first substrate 131 in some applications. Such a Lamb wave element can be a resonator of an acoustic filter that includes the BAW resonator 134 or a delay element in a phase shift circuit.

Active sides of the substrates 131 and 132 face each other. The BAW resonator 134 includes an electrode on a side of the first substrate 131 that faces a side of the second substrate 132 on which the IDT electrode of the TCSAW resonator 135 is positioned. The BAW resonator 134 and the TCSAW resonator 135 are enclosed by the first substrate 131, the second substrate 132, and sidewalls 133. The BAW resonator 134 and the TCSAW resonator 135 are hermetically sealed together within a cavity. The sidewalls 133 are included in a packaging structure that encloses the BAW resonator 134 and the TCSAW resonator 135 in a sealed volume. As illustrated, the TCSAW die and the BAW die are attached via the sidewalls 133.

One or more other components can be enclosed in the co-packaged stacked die acoustic filter component 130 together with the BAW resonator 134 and the TCSAW resonator 135. The one or more other components can include passive impedance element(s) of a tuning network, a trap circuit, phase delay elements, the like, or any suitable combination thereof. For example, the illustrated co-packaged stacked die acoustic filter component 130 includes tuning network including a tuning inductor 136. The tuning network can be a matching network. The tuning inductor 136 can be a matching inductor. The tuning network can be coupled to the acoustic wave filter that includes the series TCSAW resonator 135 and the shunt BAW resonator 134. Example tuning networks will be discussed with reference to FIGS. 14 to 15D. Alternatively or additionally, a phase shift circuit can be implemented using IDTs on the second substrate 132 to provide cancellation of noise components for the acoustic wave filter. An example of such a phase shift circuit will be discussed with reference to FIG. 16.

The illustrated co-packaged stacked die acoustic filter component 130 also includes vias 137 though the first substrate 131 to provide electrical connections to contacts 138 of the co-packaged stacked die acoustic filter component 130.

FIG. 14 is a schematic block diagram of a system 140 that includes an acoustic wave filter 142 and a tuning network 144. The tuning network 144 can provide impedance matching, phase rotation, and/or other tuning for the acoustic wave filter 142. The acoustic wave filter 142 can be implemented in accordance with any suitable principles and advantages disclosed herein. One or more components of the tuning network 144 can be co-packaged with acoustic resonators of the acoustic wave filter 142.

FIGS. 15A, 15B, 15C, and 15D are schematic diagrams of tuning networks. These tuning networks are inductor-capacitor tuning networks that can implement the tuning network 144 of FIG. 14. The tuning inductor 136 of FIG. 13 can implement any of the inductors shown in FIGS. 15A to 15D. FIG. 15A illustrates a tuning network 150 that includes a capacitor C1 in parallel with an inductor L1. FIG. 15B illustrates a tuning network 152 that includes a capacitor C1 in series with an inductor L2. FIG. 15C illustrates a tuning network 154 that includes a parallel capacitor-inductor circuit in series with an inductor L2, in which the parallel capacitor-inductor circuit includes a capacitor C1 in parallel with an inductor L1. FIG. 15C illustrates a tuning network 156 that includes a parallel capacitor-inductor circuit in series with a capacitor C2, in which the parallel capacitor-inductor circuit includes a capacitor C1 in parallel with an inductor L1. Any of the capacitors of FIGS. 15A to 15D can be implemented by an explicit capacitor and/or acoustic resonator arranged as a capacitor.

FIG. 16 is a schematic diagram of a multiplexer 160 with a phase shift circuit 166. As illustrated, the multiplexer 160 includes a first filter 162, a second filter 164, and a phase shift circuit 166. The illustrated multiplexer 160 is a duplexer. The first filter 162 and the second filter 164 are coupled together at a common node, which is an antenna node ANT in FIG. 16.

The first filter 162 can be a transmit filter and the second filter 164 can be a receive filter. Alternatively, the first filter 162 can be a receive filter and the second filter 164 can be another receive filter. Alternatively, the first filter 162 can be a transmit filter and the second filter 164 can be another receive filter.

The first filter 162 can be implemented in accordance with any suitable principles and advantages disclosed herein. For example, the first filter 162 can include series TCSAW resonators and shunt BAW resonators. The second filter 164 can be an acoustic wave filter, an inductor-capacitor filter, or a hybrid acoustic inductor-capacitor filter. In certain instances, the first filter 162 and the second filter 164 can each be implemented with at least two types of acoustic resonators in accordance with any suitable principles and advantages disclosed herein.

The phase shift circuit 166 can generate an anti-phase radio frequency (RF) signal to cancel a target signal at a desired frequency. The phase shift circuit 166 can improve the isolation and attenuation of RF acoustic wave filters, such as BAW filters (e.g., FBAR filters or SMR filters), SAW filters, and Lamb wave filters in the multiplexer 160. The illustrated phase shift circuit 166 can provide cancelation and/or isolation between a transmit port and a receive port, between two different transmit ports, or between two different receive ports. The phase shift circuit 166 can be implemented in a co-packaged stacked die acoustic filter component. For example, the phase shift circuit 166 can include IDTs on the same piezoelectric substrate as TCSAW resonators of the first filter 162 in a co-packaged stacked die acoustic filter component. The phase shift circuit 166 can be implemented in accordance with any suitable principles and advantages described in U.S. Pat. Nos. 9,246,533 and/or 9,520,857, the disclosures of each of these patents are hereby incorporated by reference in their entireties herein.

Figure 17A:
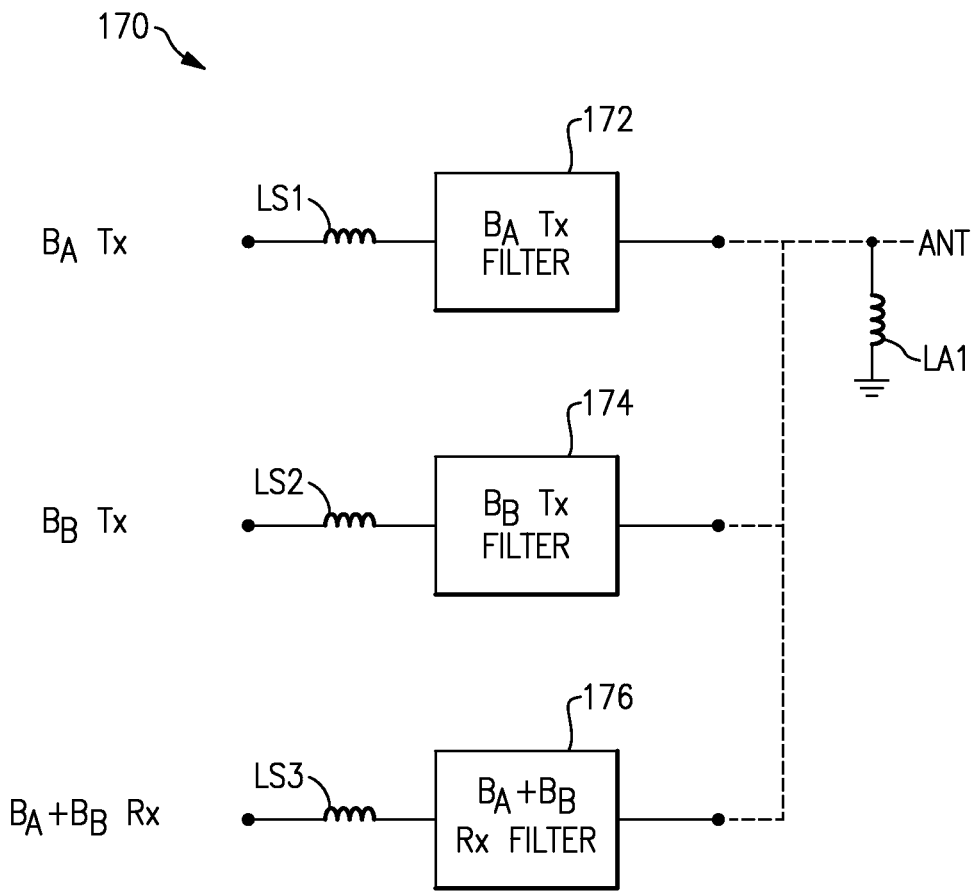
FIG. 17A is a schematic diagram of a multiplexer according to an embodiment.

FIG. 17A is a schematic diagram of a multiplexer 170 according to an embodiment. The multiplexer 170 can support dual connectivity. In dual connectivity, such as E-UTRAN New Radio-Dual Connectivity (EN-DC), fourth generation (4G) Long Term Evolution (LTE) signals and fifth generation (5G) New Radio (NR) signals can be separately received in a user equipment and the streams can be aggregated. With dual connectivity, the 4G and 5G signals can be received concurrently.

The illustrated multiplexer 170 is a triplexer. As illustrated, the multiplexer 170 includes a first transmit filter 172 coupled between a first transmit node $B_A$ Tx and a common node ANT, a second transmit filter 174 coupled between a second transmit node $B_B$ Tx and the common node ANT, and a receive filter 176 coupled between a receive node $B_A+B_B$ Rx and the common node ANT. The triplexer 170 also include a first series inductor LS1 in series between the first transmit node $B_A$ Tx and the first transmit filter 172, a second series inductor LS2 in series between the second transmit node $B_B$ Tx and the second transmit filter 174, a third series inductor LS3 in series between the receive node $B_A+B_B$ Rx and the receive filter 176, and a shunt inductor LA1 coupled to the common node ANT. In FIG. 17A, the first transmit filter 172, the second transmit filter 174, and the receive filter 176 are coupled to each other at the common node ANT. The common node ANT can be an antenna node.

Figure 17B:
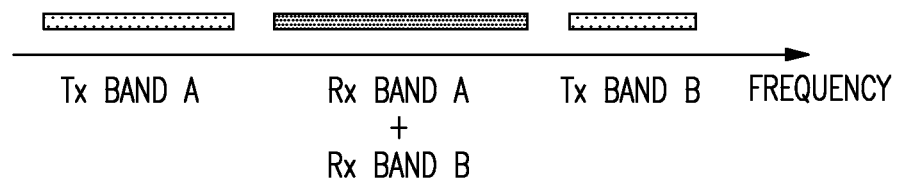
FIG. 17B is a diagram illustrating the passbands of filters of the multiplexer of FIG. 17A.

FIG. 17B is a diagram illustrating the passbands of filters 172, 174, and 176 of the multiplexer 170 of FIG. 17A. The filters 172, 174, and 176 of the multiplexer 170 can each be band pass filters. The first transmit filter 172 can have passband that includes a Band A transmit band. The second transmit filter 172 can have a passband that includes a Band B transmit band. The receive filter 176 can have a passband that includes both a Band A receive band and a Band B receive band. This can enable the receive filter 176 to concurrently receive and filter Band A and Band B receive signals. The Band A receive band can overlap with the Band B receive band in certain applications. The Band A receive band can be non-overlapping with the Band B receive band in some other applications. Band A and Band B can be associated with different radio access technologies. For example, Band A can be a 4G LTE band and Band B can be a 4G NR band.

As shown in FIG. 17B, passband of the receive filter 176 can have a lower edge that is above the passband of the first transmit filter 172 and an upper edge that is below the passband of the second transmit filter 174. The lower edge of the passband of the receive filter 176 can be relatively close to an upper edge of the passband of the first transmit filter 172. The upper edge of the passband of the receive filter 176 can be relatively close to a lower edge the passband of the second transmit filter 172.

The receive filter 176 can support a relatively wide passband and/or relatively narrow separation. The relatively wide passband can span at least two receive operating bands. The relatively narrow separation can due to a relatively narrow gap in between the respective transmit and receive operating bands. As one example, the gap between a transmit band and corresponding receive band can be less than 2% (e.g., between 0.5% and 2%) of a frequency halfway between the transmit band and the receive band.

A relatively large coupling factor and a relatively high Q at resonance can be desirable for the receive filter 176. This can contribute to the receive filter 176 achieving a relatively low insertion loss over a relatively wide passband. In the multiplexer 170, the receive filter 176 can include two types of acoustic resonators in accordance with any suitable principles and advantages disclosed herein. For example, the receive filter 176 can include a plurality of series temperature compensated surface acoustic wave resonators and a plurality of shunt bulk acoustic wave resonators together arranged to filter a radio frequency signal. The transmit filters 172 and/or 174 can include any suitable filters, such as one or more acoustic wave filters, one or more acoustic wave filters that include two or more types of acoustic wave resonators (e.g., one or more filters with series TCSAW resonators and shunt BAW resonators), one or more inductor-capacitor filters, or one or more hybrid filters that includes an inductor-capacitor filter and acoustic resonators. As one example, the transmit filters 172 and 174 can each be TCSAW filters.

Filters, such as the filter 176 of FIG. 17B, that include a pass band that spans operating bands for two different radio access technologies can be implemented in dual connectivity applications. An example dual connectivity network topology will be discussed with reference to FIG. 17C.

With the introduction of the 5G NR air interface standards, the 3rd Generation Partnership Project (3GPP) has allowed for the simultaneous operation of 5G and 4G standards in order to facilitate the transition. This mode can be referred to as Non-Stand-Alone (NSA) operation or E-UTRAN New Radio-Dual Connectivity (EN-DC) and can involve both 4G and 5G carriers being simultaneously transmitted from a user equipment (UE). EN-DC can present technical challenges for measuring power associated with individual transmit paths. Radio frequency systems disclosed herein can measure power associated with a transmit path in dual connectivity applications.

In certain EN-DC applications, dual connectivity NSA involves overlaying 5G systems onto an existing 4G core network. For dual connectivity in such applications, the control and synchronization between the base station and the UE can be performed by the 4G network while the 5G network is a complementary radio access network tethered to the 4G anchor. The 4G anchor can connect to the existing 4G network with the overlay of 5G data/control.

Figure 17C:
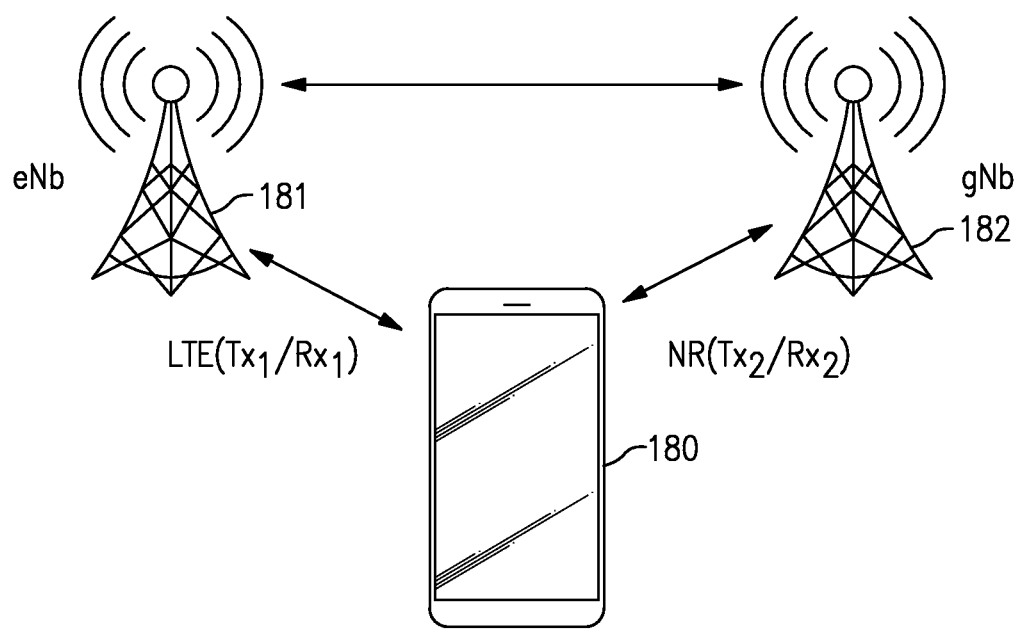
FIG. 17C is a diagram of an example dual connectivity network topology.

FIG. 17C is a diagram of an example dual connectivity network topology. This architecture can leverage LTE legacy coverage to ensure continuity of service delivery and the progressive rollout of 5G cells. A UE 180 can simultaneously receive dual downlink LTE and NR carriers. The UE 180 can receive a downlink LTE carrier Rx1 from an Evolved Node B (eNB) 181 while receiving a downlink NR carrier Rx2 from the gNode B (gNB) 182 to implement dual connectivity. Any suitable combination of uplink carriers Tx1, Tx2 and/or downlink carriers Rx1, Rx2 can be concurrently transmitted via wireless links in the example network topology of FIG. 17C. The eNB 181 can provide a connection with a core network, such as an Evolved Packet Core (EPC). The gNB 182 can communicate with the core network via the eNB 181. Control plane data can be wirelessly communicated between the UE 180 and eNB 181. The eNB 181 can also communicate control plane data with the gNB 182.

In the example dual connectivity topology of FIG. 17C, any suitable combinations of standardized bands and radio access technologies (e.g., FDD, TDD, SUL, SDL) can be wirelessly transmitted and received. This can present technical challenges related to having multiple separate radios and bands functioning in the UE 180. With a TDD LTE anchor point, network operation may be synchronous, in which case the operating modes can be constrained to Tx1/Tx2 and Rx1/Rx2, or asynchronous which can involve Tx1/Tx2, Tx1/Rx2, Rx1/Tx2, or Rx1/Rx2. When the LTE anchor is a frequency division duplex (FDD) carrier, the TDD/FDD inter-band operation can involve simultaneous Tx1/Rx1/Tx2 and Tx1/Rx1/Rx2.

Figure 18A:
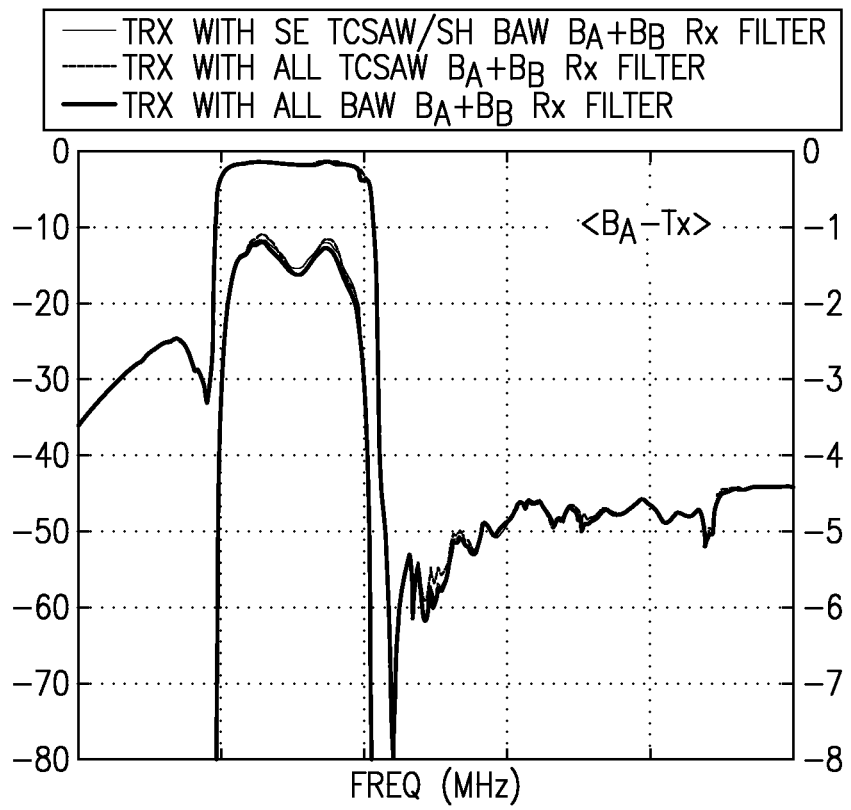
FIGS. 18A, 18B, 18C, 18D, and 18E are graphs of simulations of the multiplexer of FIG. 17A.
Figure 18B:
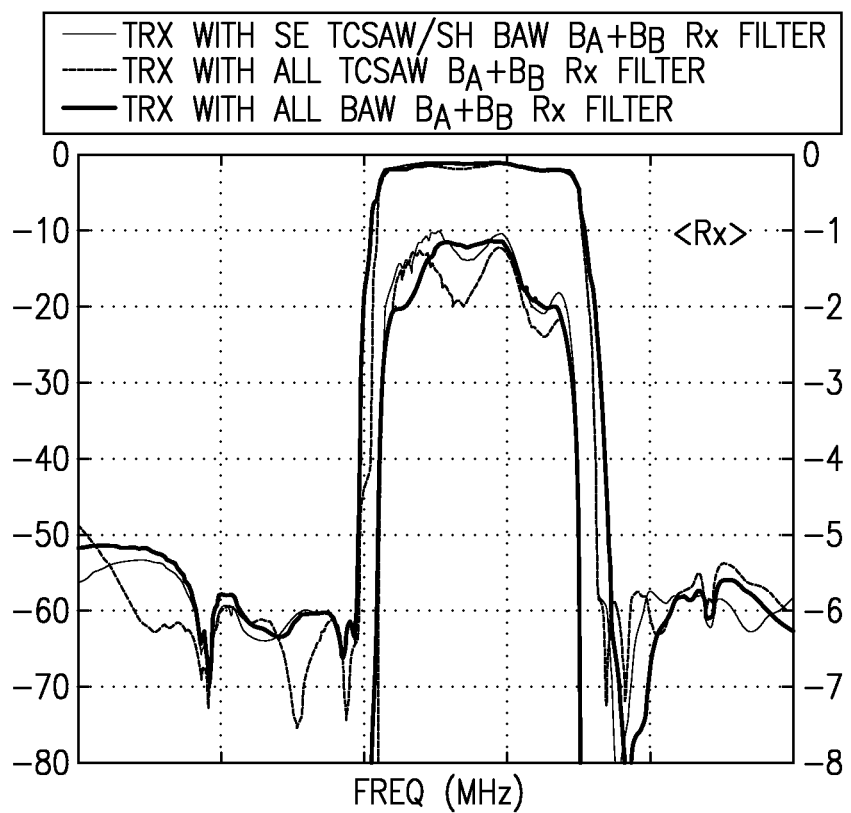
Figure 18C:
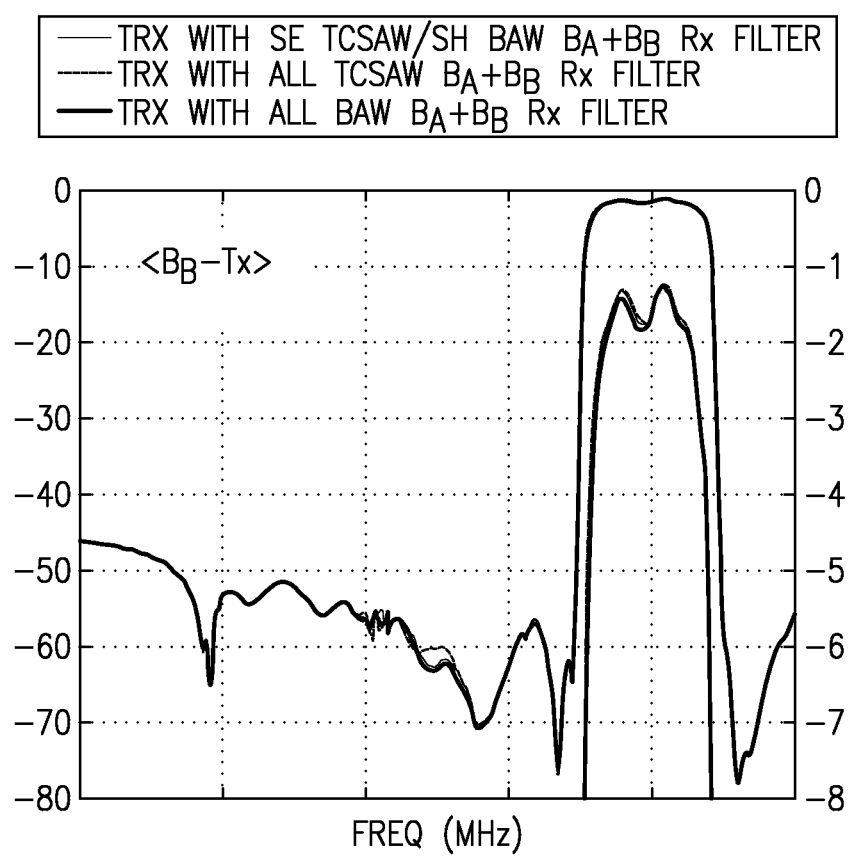

FIGS. 18A, 18B, 18C, 18D, and 18E are graphs of simulations of the multiplexer 170 of FIG. 17A. FIG. 18A is a graph that includes a curve for a passband for the first transmit filter 172 with the scale on the right side in decibels (dB) and noise in the passband with the scale on the left side in dB. FIG. 18B is a graph that includes a curve for a passband for the receive filter 176 with the scale on the right side in decibels and noise in the passband with the scale on the left side in dB. FIG. 18C is a graph that includes a curve for a passband for the second transmit filter 174 with the scale on the right side in dB and noise in the passband with the scale on the left side in dB.

Figure 18D:
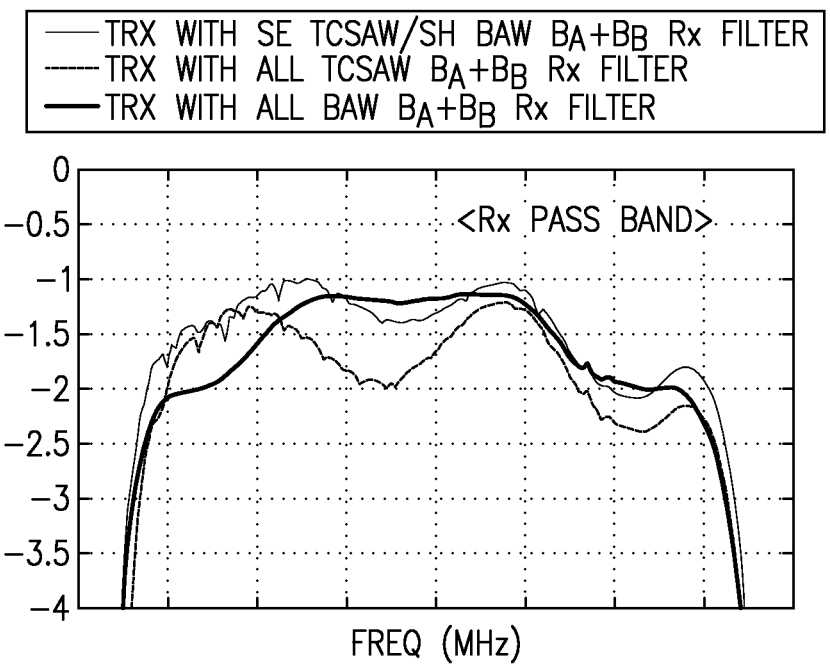
Figure 18E:
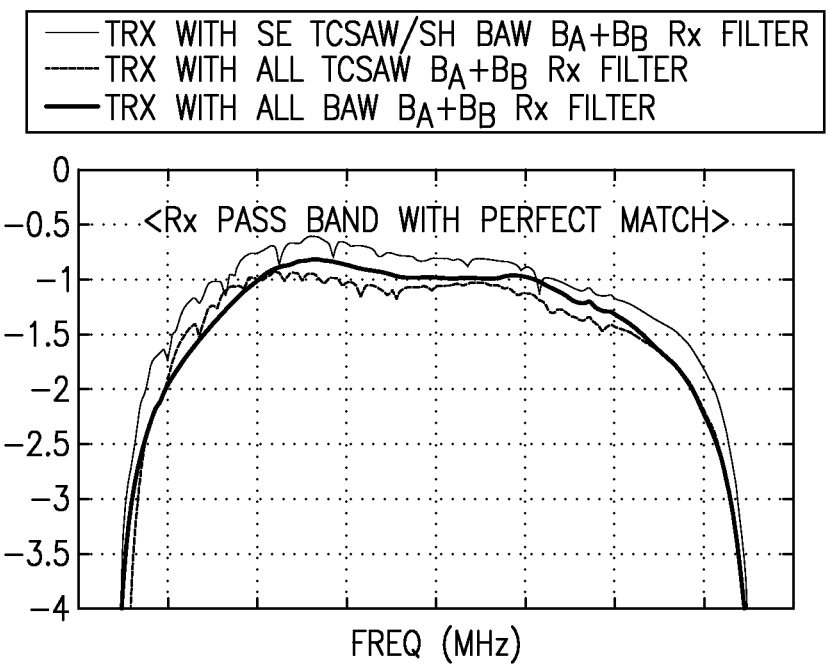

FIG. 18D zooms in on insertion loss for the receive passband from the graph of FIG. 18B. FIG. 18D is a graph of the passband for the receive filter 176 of the 176 with curves for (a) series TCSAW resonators and shunt BAW resonators, (b) all TCSAW resonators, and (c) all BAW resonators. FIG. 18E is similar to the graph of FIG. 18D but assumes perfect matching. These graphs indicate that that the receive filter 176 having series TCSAW resonators and shunt BAW resonators can improve insertion loss in the passband of the receive filter 176 by 0.3 dB to 0.5 dB relative to the other receive filters simulated.

Figure 19A:
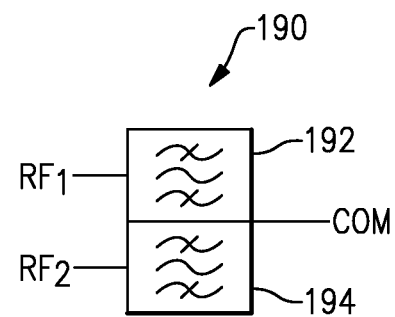
FIG. 19A is a schematic diagram of a duplexer that includes an acoustic wave filter according to an embodiment.

FIG. 19A is a schematic diagram of a duplexer 190 that includes an acoustic wave filter according to an embodiment. The duplexer 190 includes a first filter 192 and a second filter 194 coupled to together at a common node COM. One of the filters of the duplexer 190 can be a transmit filter and the other of the filters of the duplexer 190 can be a receive filter. The transmit filter and/or the receive filter can be respective ladder filters with acoustic wave resonators having a topology similar to the ladder filter 50 of FIG. 5 and the ladder filter 80 of FIG. 8A. In some other instances, such as in a diversity receive application, the duplexer 190 can include two receive filters. The common node COM can be an antenna node.

The first filter 192 is an acoustic wave filter arranged to filter a radio frequency signal. The first filter 192 can include acoustic wave resonators coupled between a first radio frequency node RF1 and the common node. The first radio frequency node RF1 can be a transmit node or a receive node. The first filter 192 includes two types of acoustic resonators in accordance with any suitable principles and advantages disclosed herein.

The second filter 194 can be any suitable filter arranged to filter a second radio frequency signal. The second filter 194 can be, for example, an acoustic wave filter, an acoustic wave filter that includes two types of acoustic resonators, an LC filter, a hybrid acoustic wave LC filter, or the like. The second filter 194 is coupled between a second radio frequency node RF2 and the common node. The second radio frequency node RF2 can be a transmit node or a receive node Although example embodiments may be discussed with filters or duplexers for illustrative purposes, any suitable the principles and advantages disclosed herein can be implemented in a multiplexer that includes a plurality of filters coupled together at a common node. Examples of multiplexers include but are not limited to a duplexer with two filters coupled together at a common node, a triplexer with three filters coupled together at a common node, a quadplexer with four filters coupled together at a common node, a hexaplexer with six filters coupled together at a common node, an octoplexer with eight filters coupled together at a common node, or the like. One or more filters of a multiplexer can include an acoustic wave filter including two types of acoustic resonators in accordance with any suitable principles and advantages disclosed herein.

Figure 19B:
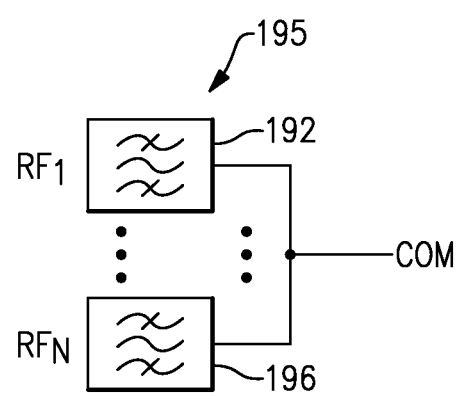
FIG. 19B is a schematic diagram of a multiplexer that includes an acoustic wave filter according to an embodiment.

FIG. 19B is a schematic diagram of a multiplexer 195 that includes an acoustic wave filter according to an embodiment. The multiplexer 195 includes a plurality of filters 192 to 196 coupled together at a common node COM. The plurality of filters can include any suitable number of filters including, for example, 3 filters, 4 filters, 5 filters, 6 filters, 7 filters, 8 filters, or more filters. Some or all of the plurality of acoustic wave filters can be acoustic wave filters.

The first filter 192 is an acoustic wave filter arranged to filter a radio frequency signal. The first filter 192 can include acoustic wave resonators coupled between a first radio frequency node RF1 and the common node. The first radio frequency node RF1 can be a transmit node or a receive node. The first filter 192 includes two types of acoustic resonators in accordance with any suitable principles and advantages disclosed herein. The other filter(s) of the multiplexer 195 can include one or more acoustic wave filters, one or more acoustic wave filters that include two types of acoustic resonators in accordance with any suitable principles and advantages disclosed herein, one or more LC filters, one or more hybrid acoustic wave LC filters, or any suitable combination thereof.

The acoustic wave filters disclosed herein can be implemented in a variety of packaged modules. Some example packaged modules will now be disclosed in which any suitable principles and advantages of the acoustic wave filters and/or acoustic wave resonators disclosed herein can be implemented. The example packaged modules can include a package that encloses the illustrated circuit elements. A module that includes a radio frequency component can be referred to as a radio frequency module. The illustrated circuit elements can be disposed on a common packaging substrate. The packaging substrate can be a laminate substrate, for example. FIGS. 20 to 24 are schematic block diagrams of illustrative packaged modules according to certain embodiments. Any suitable combination of features of these packaged modules can be implemented with each other. While duplexers are illustrated in the example packaged modules of FIGS. 21, 22, and 24, any other suitable multiplexer that includes a plurality of filters coupled to a common node and/or standalone filter can be implemented instead of one or more duplexers. For example, a triplexer can be implemented in certain applications. As another example, one or more filters of a packaged module can be arranged as a transmit filter or a receive filter that is not included in a multiplexer.

Figure 20:
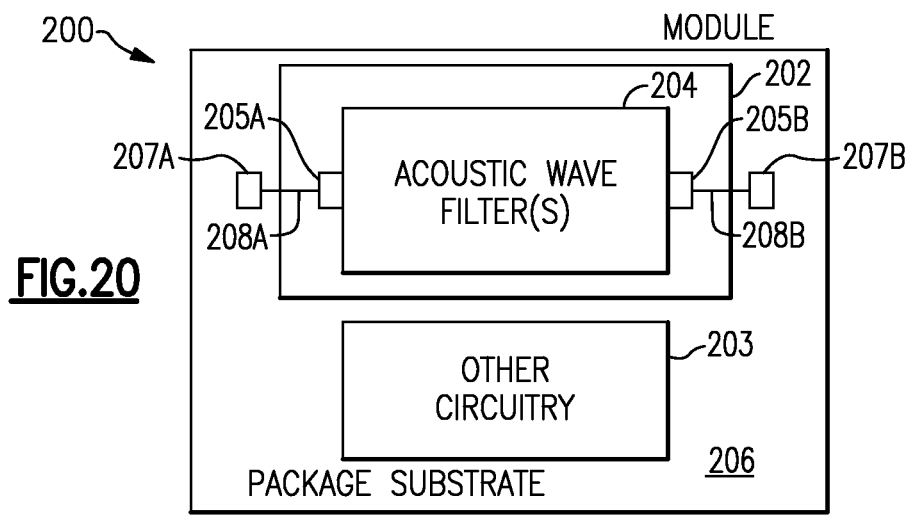
FIG. 20 is a schematic diagram of a radio frequency module that includes an acoustic wave filter according to an embodiment.

FIG. 20 is a schematic diagram of a radio frequency module 200 that includes an acoustic wave component 202 according to an embodiment. The illustrated radio frequency module 200 includes the acoustic wave component 202 and other circuitry 203. The acoustic wave component 202 can include one or more acoustic wave filters in accordance with any suitable combination of features of the acoustic wave filters disclosed herein. The acoustic wave component 202 can include an acoustic wave filter with series TCSAW resonators and shunt BAW resonators, for example.

The acoustic wave component 202 shown in FIG. 20 includes one or more acoustic wave filters 204 and terminals 205A and 205B. The one or more acoustic wave filters 204 includes an acoustic wave filter implemented in accordance with any suitable principles and advantages disclosed herein. The terminals 205A and 204B can serve, for example, as an input contact and an output contact. Although two terminals are illustrated, any suitable number of terminals can be implemented for a particular application. The acoustic wave component 202 and the other circuitry 203 are on a common packaging substrate 206 in FIG. 20. The package substrate 206 can be a laminate substrate. The terminals 205A and 205B can be electrically connected to contacts 207A and 207B, respectively, on the packaging substrate 206 by way of electrical connectors 208A and 208B, respectively. The electrical connectors 208A and 208B can be bumps or wire bonds, for example.

The other circuitry 203 can include any suitable additional circuitry. For example, the other circuitry can include one or more radio frequency amplifiers (e.g., one or more power amplifiers and/or one or more low noise amplifiers), one or more radio frequency switches, one or more additional filters, one or more RF couplers, one or more delay lines, one or more phase shifters, the like, or any suitable combination thereof. The other circuitry 203 can be electrically connected to the one or more acoustic wave filters 204. The radio frequency module 200 can include one or more packaging structures to, for example, provide protection and/or facilitate easier handling of the radio frequency module 200. Such a packaging structure can include an overmold structure formed over the packaging substrate 206. The overmold structure can encapsulate some or all of the components of the radio frequency module 200.

Figure 21:
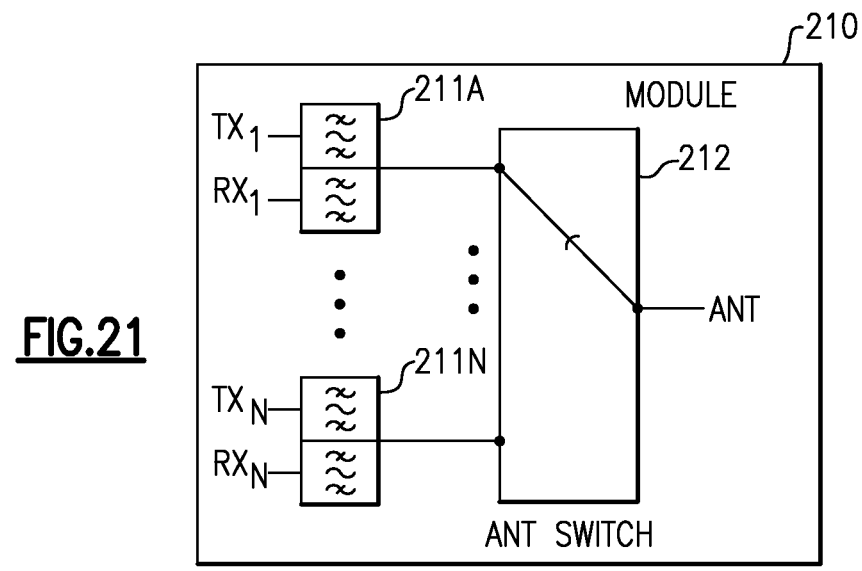
FIG. 21 is a schematic block diagram of a module that includes an antenna switch and duplexers according to an embodiment.

FIG. 21 is a schematic block diagram of a module 210 that includes duplexers 211A to 211N and an antenna switch 212. One or more filters of the duplexers 211A to 211N can include an acoustic wave filter in accordance with any suitable principles and advantages disclosed herein. Any suitable number of duplexers 211A to 211N can be implemented. The antenna switch 212 can have a number of throws corresponding to the number of duplexers 211A to 211N. The antenna switch 212 can include one or more additional throws coupled to one or more filters external to the module 210 and/or coupled to other circuitry. The antenna switch 212 can electrically couple a selected duplexer to an antenna port of the module 210.

Figure 22:
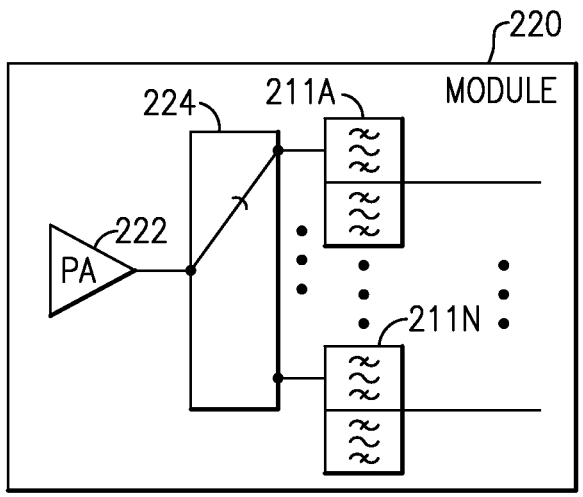
FIG. 22 is a schematic block diagram of a module that includes a power amplifier, a radio frequency switch, and duplexers according to an embodiment.

FIG. 22 is a schematic block diagram of a module 220 that includes a power amplifier 222, a radio frequency switch 224, and duplexers 211A to 211N according to an embodiment. The power amplifier 222 can amplify a radio frequency signal. The radio frequency switch 224 can be a multi-throw radio frequency switch. The radio frequency switch 224 can electrically couple an output of the power amplifier 222 to a selected transmit filter of the duplexers 211A to 211N. One or more filters of the duplexers 211A to 211N can be an acoustic wave filter in accordance with any suitable principles and advantages disclosed herein. Any suitable number of duplexers 211A to 211N can be implemented.

Figure 23:
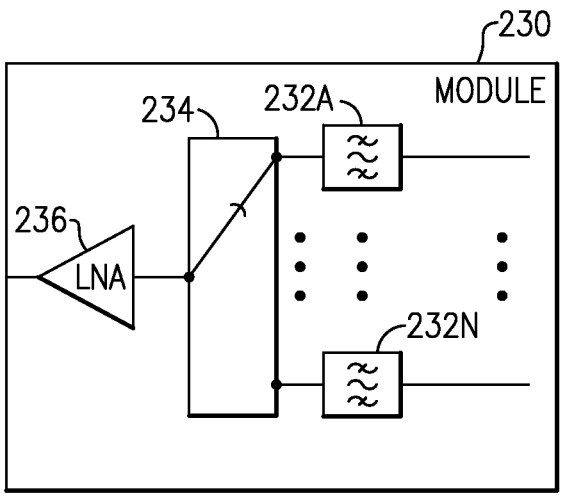
FIG. 23 is a schematic block diagram of a module that includes a low noise amplifier, a radio frequency switch, and filters according to an embodiment.

FIG. 23 is a schematic block diagram of a module 230 that includes filters 232A to 232N, a radio frequency switch 234, and a low noise amplifier 236 according to an embodiment. One or more filters of the filters 232A to 232N can include any suitable number of acoustic wave filters in accordance with any suitable principles and advantages disclosed herein. Any suitable number of filters 232A to 232N can be implemented. The illustrated filters 232A to 232N are receive filters. In some embodiments (not illustrated), one or more of the filters 232A to 232N can be included in a multiplexer that also includes a transmit filter. The radio frequency switch 234 can be a multi-throw radio frequency switch. The radio frequency switch 234 can electrically couple an output of a selected filter of filters 232A to 232N to the low noise amplifier 236. In some embodiments (not illustrated), a plurality of low noise amplifiers can be implemented. The module 230 can include diversity receive features in certain applications.

Figure 24:
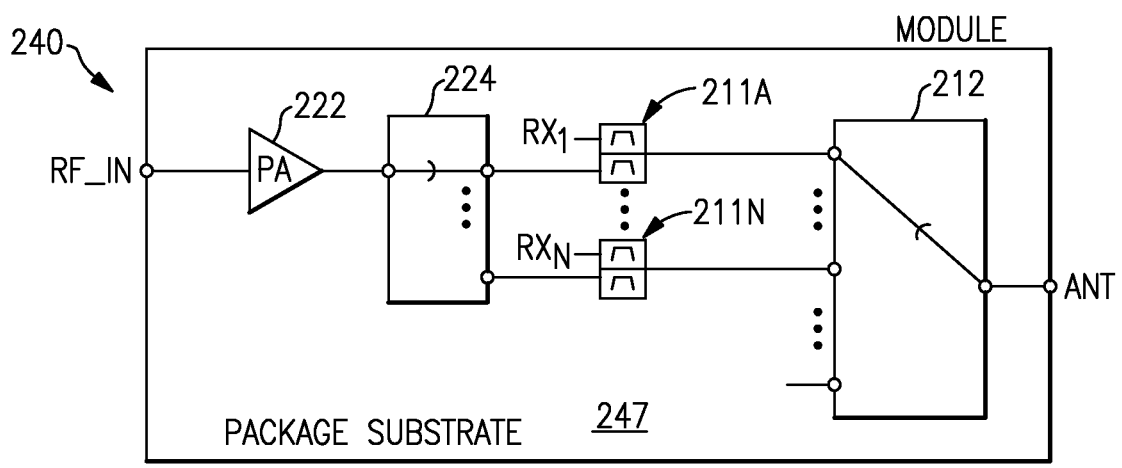
FIG. 24 is a schematic diagram of a radio frequency module that includes an acoustic wave filter according to an embodiment.

FIG. 24 is a schematic diagram of a radio frequency module 240 that includes an acoustic wave filter according to an embodiment. As illustrated, the radio frequency module 240 includes duplexers 211A to 211N, a power amplifier 222, a select switch 224, and an antenna switch 212. The radio frequency module 240 can include a package that encloses the illustrated elements. The illustrated elements can be disposed on a common packaging substrate 247. The packaging substrate 247 can be a laminate substrate, for example. A radio frequency module that includes a power amplifier can be referred to as a power amplifier module. A radio frequency module can include a subset of the elements illustrated in FIG. 24 and/or additional elements. The radio frequency module 240 may include any one of the acoustic wave filters in accordance with any suitable principles and advantages disclosed herein.

The duplexers 211A to 211N can each include two acoustic wave filters coupled to a common node. For example, the two acoustic wave filters can be a transmit filter and a receive filter. As illustrated, the transmit filter and the receive filter can each be a band pass filter arranged to filter a radio frequency signal. One or more of the transmit filters can include an acoustic wave filter in accordance with any suitable principles and advantages disclosed herein. Similarly, one or more of the receive filters can include an acoustic wave filter in accordance with any suitable principles and advantages disclosed herein. Although FIG. 24 illustrates duplexers, any suitable principles and advantages disclosed herein can be implemented in other multiplexers (e.g., quadplexers, hexaplexers, octoplexers, etc.) and/or in switch-plexers and/or with standalone filters.

The power amplifier 222 can amplify a radio frequency signal. The illustrated switch 224 is a multi-throw radio frequency switch. The switch 224 can electrically couple an output of the power amplifier 222 to a selected transmit filter of the transmit filters of the duplexers 211A to 211N. In some instances, the switch 224 can electrically connect the output of the power amplifier 222 to more than one of the transmit filters. The antenna switch 212 can selectively couple a signal from one or more of the duplexers 211A to 211N to an antenna port ANT. The duplexers 211A to 211N can be associated with different frequency bands and/or different modes of operation (e.g., different power modes, different signaling modes, etc.).

Figure 25A:
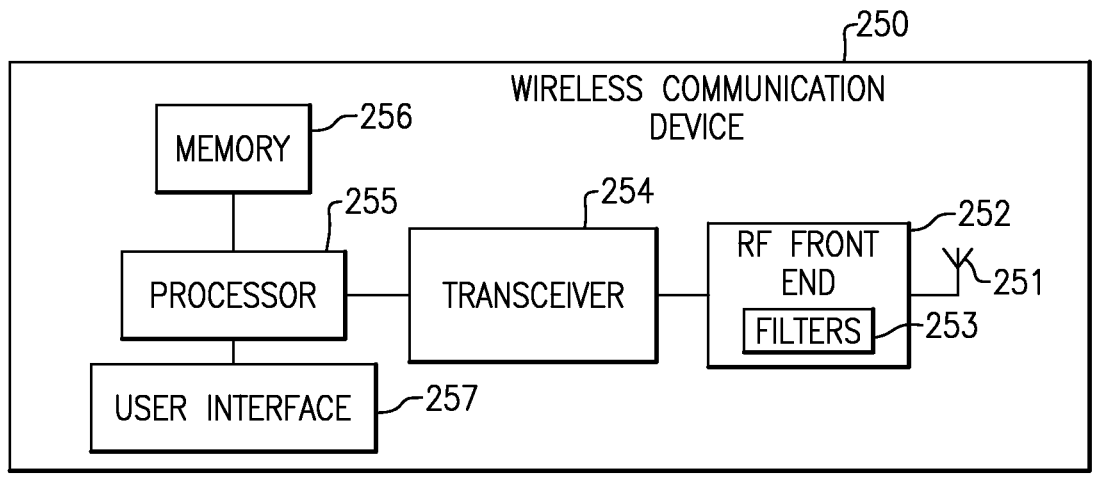
FIG. 25A is a schematic block diagram of a wireless communication device that includes an acoustic wave filter according to an embodiment.

The acoustic wave filters disclosed herein can be implemented in a variety of wireless communication devices. FIG. 25A is a schematic diagram of a wireless communication 250 device that includes filters 253 in a radio frequency front end 252 according to an embodiment. One or more of the filters 253 can be acoustic wave filter in accordance with any suitable principles and advantages disclosed herein. The wireless communication device 250 can be any suitable wireless communication device. For instance, a wireless communication device 250 can be a mobile phone, such as a smart phone. As illustrated, the wireless communication device 250 includes an antenna 251, an RF front end 252, a transceiver 254, a processor 255, a memory 256, and a user interface 257. The antenna 251 can transmit RF signals provided by the RF front end 252. Such RF signals can include carrier aggregation signals. The antenna 251 can receive RF signals and provide the received RF signals to the RF front end 252 for processing. Such RF signals can include carrier aggregation signals. The wireless communication device 250 can include two or more antennas in certain instances.

The RF front end 252 can include one or more power amplifiers, one or more low noise amplifiers, one or more RF switches, one or more receive filters, one or more transmit filters, one or more duplex filters, one or more multiplexers, one or more frequency multiplexing circuits, the like, or any suitable combination thereof. The RF front end 252 can transmit and receive RF signals associated with any suitable communication standards. One or more of the filters 253 can include an acoustic wave filter with two types of acoustic resonators that includes any suitable combination of features of the embodiments disclosed above.

The transceiver 254 can provide RF signals to the RF front end 252 for amplification and/or other processing. The transceiver 254 can also process an RF signal provided by a low noise amplifier of the RF front end 252. The transceiver 254 is in communication with the processor 255. The processor 255 can be a baseband processor. The processor 255 can provide any suitable base band processing functions for the wireless communication device 250. The memory 256 can be accessed by the processor 255. The memory 256 can store any suitable data for the wireless communication device 250. The user interface 257 can be any suitable user interface, such as a display with touch screen capabilities.

Figure 25B:
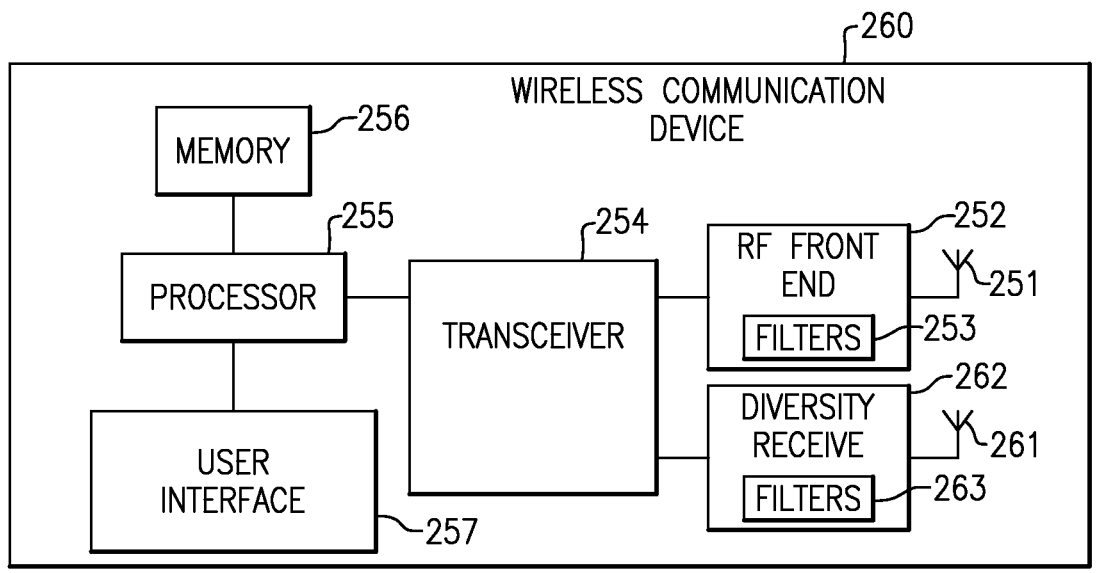
FIG. 25B is a schematic block diagram of another wireless communication device that includes an acoustic wave filter according to an embodiment.

FIG. 25B is a schematic diagram of a wireless communication device 260 that includes filters 253 in a radio frequency front end 252 and second filters 263 in a diversity receive module 262. The wireless communication device 260 is like the wireless communication device 250 of FIG. 25A, except that the wireless communication device 260 also includes diversity receive features. As illustrated in FIG. 25B, the wireless communication device 260 includes a diversity antenna 261, a diversity module 262 configured to process signals received by the diversity antenna 261 and including filters 263, and a transceiver 254 in communication with both the radio frequency front end 252 and the diversity receive module 262. One or more of the second filters 263 can include an acoustic wave filter in accordance with any suitable principles and advantages disclosed herein.

Any of the embodiments described above can be implemented in association with mobile devices such as cellular handsets. The principles and advantages of the embodiments can be used for any systems or apparatus, such as any uplink wireless communication device, that could benefit from any of the embodiments described herein. The teachings herein are applicable to a variety of systems. Although this disclosure includes example embodiments, the teachings described herein can be applied to a variety of structures. Any of the principles and advantages discussed herein can be implemented in association with RF circuits configured to process signals having a frequency in a range from about 30 kHz to 300 GHz, such as in a frequency range from about 400 MHz to 8.5 GHz.

An acoustic wave filter including any suitable combination of features disclosed herein be arranged to filter a radio frequency signal in a 5G NR operating band within Frequency Range 1 (FR1). A filter arranged to filter a radio frequency signal in a 5G NR operating band can include two types of acoustic resonators in accordance with any principles and advantages disclosed herein. FR1 can be from 410 MHz to 7.125 GHz, for example, as specified in a current 5G NR specification. In 5G applications, an acoustic wave filter with a relatively wide pass band and relatively low insertion loss can be advantageous for implementing dual connectivity. An acoustic wave filter in accordance with any suitable principles and advantages disclosed herein can be arranged to filter a radio frequency signal in a 4G LTE operating band and/or in a filter having a passband that includes a 4G LTE operating band and a 5G NR operating band. Filters disclosed herein can filter radio frequency signals in a frequency range from about 400 MHz to 3 GHz in certain applications.

Aspects of this disclosure can be implemented in various electronic devices. Examples of the electronic devices can include, but are not limited to, consumer electronic products, parts of the consumer electronic products such as packaged radio frequency modules, radio frequency filter die, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a microwave, a refrigerator, a vehicular electronics system such as an automotive electronics system, a robot such as an industrial robot, an Internet of things device, a stereo system, a digital music player, a radio, a camera such as a digital camera, a portable memory chip, a home appliance such as a washer or a dryer, a peripheral device, a wrist watch, a clock, etc. Further, the electronic devices can include unfinished products.

Unless the context indicates otherwise, throughout the description and the claims, the words "comprise," "comprising," "include," "including" and the like are to generally be construed in an inclusive sense, as opposed to an exclusive or exhaustive sense; that is to say, in the sense of "including, but not limited to." Conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. The word "coupled", as generally used herein, refers to two or more elements that may be either directly coupled, or coupled by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively.

While certain embodiments have been described, these embodiments have been presented by way of example only, and are not intended to limit the scope of the disclosure. Indeed, the novel resonators, filters, multiplexer, devices, modules, wireless communication devices, apparatus, methods, and systems described herein may be embodied in a variety of other forms. Furthermore, various omissions, substitutions and changes in the form of the resonators, filters, multiplexer, devices, modules, wireless communication devices, apparatus, methods, and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and/or acts of the various embodiments described above can be combined to provide further embodiments. The accompanying claims and their equivalents are intended to cover such forms or modifications as would fall within the scope and spirit of the disclosure.

What is claimed is:

1. An acoustic filter component comprising:
   a first die including a plurality of temperature compensated surface acoustic wave resonators, a multi-mode surface acoustic wave filter in series with the plurality of temperature compensated surface acoustic wave resonators, and a tuning inductor; the first die including a side on which an interdigital transducer electrode of a first temperature compensated surface acoustic wave resonator of the plurality of temperature compensated surface acoustic wave resonators, the multi-mode surface acoustic wave filter, and the tuning inductor are positioned; and
   a second die including a plurality of bulk acoustic wave resonators and a series bulk acoustic wave resonator, the second die including a side on which an electrode of a first bulk acoustic wave resonator of the plurality of bulk acoustic wave resonators is positioned, the first bulk acoustic wave resonator including a raised frame structure, the side of the second die facing the side of the first die, the first die stacked with and attached to the second die, the plurality of bulk acoustic wave resonators are shunt resonators of an acoustic wave filter, the plurality of temperature compensated surface acoustic wave resonators are series resonators of the acoustic wave filter that are connected to an input/output port of the acoustic wave filter by way of the series bulk acoustic wave resonator, the acoustic wave filter having a passband that spans a first operating band and a second operating band, a transmit band associated with the second operating band being separated from the second operating band by a gap that is less than 2% of a frequency halfway between the transmit band and the second operating band, the first operating band and the second operating band are associated with different radio access technologies, and the acoustic wave filter is a receive filter arranged to support dual connectivity.

2. The acoustic filter component of claim 1 further comprising sidewalls positioned between the first die and the second die, the sidewalls being included in a packaging structure that encloses the plurality of temperature compensated surface acoustic wave resonators and the plurality of bulk acoustic wave resonators in a sealed volume.

3. The acoustic filter component of claim 1 further comprising a phase shift circuit co-packaged with the plurality of temperature compensated surface acoustic wave resonators and the plurality of bulk acoustic wave resonators.

4. The acoustic filter component of claim 1 wherein the first die includes a second plurality of surface acoustic wave resonators of a second acoustic wave filter, the second die includes a second plurality of bulk acoustic wave resonators of the second acoustic wave filter, and the acoustic wave filter and the second acoustic wave filter are included in a multiplexer.

5. The acoustic filter component of claim 1 wherein a quality factor of the first bulk acoustic wave resonator is higher than a quality factor of the first temperature compensated surface acoustic wave resonator in a frequency range between the resonant frequency of the first bulk acoustic wave resonator to an anti-resonant frequency of the first bulk acoustic wave resonator.

6. A multiplexer comprising:
   a first filter including a plurality of series temperature compensated surface acoustic wave resonators, a multi-mode surface acoustic wave filter in series with the series temperature compensated surface acoustic wave resonators, a series bulk acoustic wave resonator coupled between the series temperature compensated surface acoustic wave resonators and a common node, and shunt bulk acoustic wave resonators together arranged to filter a radio frequency signal, a first shunt bulk acoustic wave resonator of the shunt bulk acoustic wave resonators has a resonant frequency that is lower than a resonant frequency of a first series temperature compensated surface acoustic wave resonator of the series temperature compensated surface acoustic wave resonators, the first filter being a receive band pass filter having a first passband that includes two operating bands associated with different radio access technologies, and the first filter being arranged to support dual connectivity;
   a second filter coupled to the first filter at the common node, the second filter being a transmit filter having a second passband associated with a first of the two operating bands, the second passband being below the first passband, and the second passband being separated from the first passband by a gap that is less than 2% of a frequency halfway between the first passband and the second passband;
   a third filter coupled to the common node, the third filter being a transmit filter having a third passband associated with a second of the two operating bands, the third passband being above the first passband; and
   an inductor that is co-packaged with the series temperature compensated surface acoustic wave resonators and the shunt bulk acoustic wave resonators.

7. The multiplexer of claim 6 wherein the series temperature compensated surface acoustic wave resonators are on a first die and the shunt bulk acoustic wave resonators are on a second die, the series temperature compensated surface acoustic wave resonators include respective interdigital transducer electrodes on a side of the first die that is facing a side of the second die on which electrodes of respective shunt bulk acoustic wave resonators are located.

8. The multiplexer of claim 6 wherein a quality factor of the first shunt bulk acoustic wave resonator is higher than a quality factor of the first series temperature compensated surface acoustic wave resonator in a frequency range between the resonant frequency of the first shunt bulk acoustic wave resonator to an anti-resonant frequency of the first shunt bulk acoustic wave resonator.

9. The multiplexer of claim 6 wherein the two operating bands are non-overlapping.

10. The multiplexer of claim 6 wherein the multiplexer is a triplexer.

11. The multiplexer of claim 6 further comprising a phase shift circuit co-packaged with the series temperature compensated surface acoustic wave resonators and the shunt bulk acoustic wave resonators.

12. The multiplexer of claim 6 wherein the second filter includes a second plurality of series temperature compensated surface acoustic wave resonators and a second plurality of shunt bulk acoustic wave resonators.

13. A wireless communication device comprising:
   a first filter including series temperature compensated surface acoustic wave resonators, a series bulk acoustic wave resonator, and shunt bulk acoustic wave resonators together arranged to filter a radio frequency signal, the first filter being a receive band pass filter having a first passband that includes two operating bands associated with different radio access technologies, and the series temperature compensated surface acoustic wave resonators are coupled to a common node by way of the series bulk acoustic wave resonator;

a second filter coupled to the first filter at the common node, the second filter being a transmit filter having a second passband associated with a first of the two operating bands, the second passband being below the first passband;

a third filter coupled to the common node, the third filter being a transmit filter having a third passband associated with a second of the two operating bands, the third passband being above the first passband, and the third passband being separated from the first passband by a gap that is less than 2% of a frequency halfway between the first passband and the third passband; and at least one antenna configured to concurrently receive a first radio frequency signal associated with the first of the two operating bands and a second radio frequency signal associated with the second of the two operating bands, the first filter configured to support dual connectivity by concurrently filtering the first radio frequency signal and the second radio frequency signal.

14. The wireless communication device of claim 13 further comprising a low noise amplifier operatively coupler to the first filter and a transceiver in communication with the low noise amplifier.

15. The wireless communication device of claim 13 wherein the series temperature compensated surface acoustic wave resonators are on a first die and the shunt bulk acoustic wave resonators are on a second die, the series temperature compensated surface acoustic wave resonators include respective interdigital transducer electrodes on a side of the first die that is facing a side of the second die on which electrodes of respective shunt bulk acoustic wave resonators are located.

16. The wireless communication device of claim 15 further comprising an inductor that is co-packaged with the series temperature compensated surface acoustic wave resonators and the shunt bulk acoustic wave resonators.

17. The wireless communication device of claim 15 further comprising a phase shift circuit co-packaged with the series temperature compensated surface acoustic wave resonators and the shunt bulk acoustic wave resonators.

18. The wireless communication device of claim 13 wherein the two operating bands are non-overlapping.

19. The wireless communication device of claim 13 wherein the wireless communication device is a mobile phone.

* * * * *